(12) United States Patent
Hong et al.

(10) Patent No.: US 12,745,494 B2
(45) Date of Patent: Sep. 22, 2026

(54) COMPUTER SIMULATION FOR FABRICATING A LIGHT-EMITTING DEVICE

(71) Applicants: HON HAI PRECISION INDUSTRY CO., LTD., New Taipei City (TW); National Yang Ming Chiao Tung University, Hsinchu City (TW)

(72) Inventors: Yu-Heng Hong, New Taipei City (TW); Wei-Cheng Tsai, New Taipei City (TW); Yao-Wei Huang, New Taipei City (TW); Shih-Chen Chen, New Taipei City (TW); Hao-Chung Kuo, New Taipei City (TW)

(73) Assignees: HON HAI PRECISION INDUSTRY CO., LTD., New Taipei City (TW); National Yang Ming Chiao Tung University, Hsinchu City (TW)

( * ) Notice: Subject to any disclaimer, the term of this patent is extended or adjusted under 35 U.S.C. 154(b) by 742 days.

(21) Appl. No.: 18/064,936

(22) Filed: Dec. 13, 2022

(65) Prior Publication Data

US 2024/0030391 A1 Jan. 25, 2024

(30) Foreign Application Priority Data

Jul. 22, 2022 (TW) ................................ 111127619

(51) Int. Cl.
*H10H 20/855* (2025.01)
*H01S 5/042* (2006.01)
(Continued)

(52) U.S. Cl.
CPC ....... *H10H 20/855* (2025.01); *H01S 5/04254* (2019.08); *H01S 5/18386* (2013.01);
(Continued)

(58) Field of Classification Search
CPC ............ H10H 20/855; H10H 20/0363; H10H 20/872; H01S 5/18386; H01S 5/04254; H01S 5/11
See application file for complete search history.

(56) References Cited

U.S. PATENT DOCUMENTS 9,739,918 B2 * 8/2017 Arbabi .................. G02B 5/021
9,995,859 B2 * 6/2018 Kamali ............. G02B 27/4211
(Continued)

FOREIGN PATENT DOCUMENTS

CN 105487145 A 4/2016
CN 108318947 A 7/2018
(Continued)

*Primary Examiner* — Alonzo Chambliss
(74) *Attorney, Agent, or Firm* — CKC & Partners Co., LLC

(57) ABSTRACT

A method of manufacturing a light-emitting device includes a number of operations. A light-emitting element is formed. A simulation of a metasurface is performed. The metasurface is formed based on the simulation of the metasurface. The metasurface is disposed on a light-emitting side of the light-emitting element. Performing the simulation of the metasurface includes establishing a metasurface model of the metasurface, in which the metasurface model has a plurality of unit cells, and phase compensation values of the unit cells are periodically distributed with a supercell period length in a deflection direction. The phase compensation values of the unit cell are adjusted and the light source is set to simulate the multiple transmittances of the metasurface model under different phase compensation values. The phase compensation values at a peak value of transmittance are selected as process parameters of the metasurface.

14 Claims, 16 Drawing Sheets

(51) Int. Cl.
*H01S 5/11* (2021.01)
*H01S 5/183* (2006.01)
*H10H 20/01* (2025.01)
*H10H 20/80* (2025.01)

(52) U.S. Cl.
CPC ............ *H01S 5/11* (2021.01); *H10H 20/0363* (2025.01); *H10H 20/872* (2025.01)

(56) References Cited

U.S. PATENT DOCUMENTS

| | | | | |
|---|---|---|---|---|
| 2023/0280499 | A1 * | 9/2023 | Hao | G02B 5/1809 359/642 |
| 2024/0178354 | A1 * | 5/2024 | Hao | H10H 20/821 |

FOREIGN PATENT DOCUMENTS

| | | | | | |
|---|---|---|---|---|---|
| CN | 109031477 | A | | 12/2018 | |
| CN | 109164574 | A | | 1/2019 | |
| CN | 111220273 | A | * | 6/2020 | G01J 4/00 |
| CN | 111679351 | A | | 9/2020 | |
| CN | 113805264 | A | | 12/2021 | |
| CN | 113851573 | A | | 12/2021 | |
| CN | 113917578 | A | | 1/2022 | |
| TW | 202024723 | A | | 7/2020 | |
| TW | 202201076 | A | | 1/2022 | |
| WO | WO-2019125306 | A1 | * | 6/2019 | G02B 1/005 |

* cited by examiner

COMPUTER SIMULATION FOR FABRICATING A LIGHT-EMITTING DEVICE

RELATED APPLICATIONS

This application claims priority to Taiwan Application Serial Number 111127619, filed Jul. 22, 2022, which is herein incorporated by reference in its entirety.

BACKGROUND

Field of Invention

The present disclosure relates to light-emitting devices and methods of manufacturing thereof.

Description of Related Art

With the advancement of display technology, visual effects can be controlled or improved by applying a metasurface. The metasurface can be applied to a light-emitting element, which can further realize the control of the light beam of a passive light-emitting element, and the size of the metasurface can be similar to or even lower than the light wavelength of the light-emitting element. For example, the metasurface formed by meta-atoms can have a sub-wavelength geometry. However, since the metasurface has a small size, a direct integration of the metasurface and a light-emitting element would affect the integration accuracy and the performance of the final integrated device and even lead to the loss of energy of the emitted light from the light-emitting element.

Therefore, those in the industry are endeavoring to find a solution that can slow down the strong reflection phenomenon that occurs in the heterogeneous integrated interface, reduce the light-emitting energy loss of the light-emitting element, and further improve the performance of the light-emitting device that finally integrates the light-emitting element and the metasurface.

SUMMARY

An aspect of the present disclosure is related to a method of manufacturing a light-emitting device.

According to one or more embodiments of the present disclosure, a method of manufacturing light-emitting device includes a number of operations. A light-emitting element is formed. A simulation of a metasurface is performed by a computer. Performing the simulation of the metasurface by the computer includes a number of operations. A deflection direction and a deflection angle are determined. A supercell period length is determined based on the deflection angle and a light wavelength of the light-emitting element. A metasurface model of the metasurface is established, wherein the metasurface model has a plurality of unit cells being respectively with a plurality of phase compensation values, and the phase compensation values of the unit cells are spatially arranged along the deflection direction. The phase compensation values of the unit cells are adjusted and a light source of the light wavelength is set to simulate a plurality of transmittances with respect to the phase compensation values in the metasurface model. The phase compensation values at a peak of the transmittances are selected as a plurality of processing parameters of the metasurface. The method further includes forming the metasurface based on the processing parameters, and disposing the metasurface on a light-emitting side of the light-emitting element.

In one or more embodiments of the present disclosure, the formed metasurface on the light-emitting element further includes a transparent substrate, and a plurality of meta-atoms are formed on the transparent substrate. Disposing the metasurface on the light-emitting side of the light-emitting element includes heterogeneously bonding the transparent substrate on the light-emitting side of the light-emitting element.

In one or more embodiments of the present disclosure, the unit cells are periodically arranged in a hexagonal lattice.

In one or more embodiments of the present disclosure, each of the unit cells includes a meta-atom rod, the meta-atom rods include a plurality of square rods or circle rods with the same heights, and the meta-atom rods of the unit cells respectively induce the phase compensation values of the unit cells. Adjusting the phase compensation values includes adjusting a plurality of widths of the meta-atom rods.

In one or more embodiments of the present disclosure, a plurality of supercells is defined by the supercell period length from the unit cells of the metasurface model. Each of the supercells includes a first unit cell and a plurality of subordinate unit cells. The first unit cell has a first phase compensation value. The subordinate unit cells are arranged equidistantly along the deflection direction relative to the first unit cell, wherein the subordinate unit cells have a plurality of subordinate phase compensation values increasing equally along the deflection direction with respect to the first unit cell. Adjusting the phase compensation values of the unit cells further includes for each of the supercells, adjusting the first phase compensation value of the first unit cell, such that the subordinate phase compensation values of the subordinate unit cells are adjusted with respect to the first phase compensation value.

In one or more embodiments of the present disclosure, the light-emitting element includes a dielectric layer on the light-emitting side of the light-emitting element. Forming the light-emitting element includes selecting a material of the dielectric layer based on the formed metasurface to reduce a reflectivity at an interface between the metasurface and the dielectric layer.

In one or more embodiments of the present disclosure, the formed metasurface on the light-emitting element further includes a transparent substrate configured to be bonded on the light-emitting side of the light-emitting element. Forming the metasurface includes selecting a material of the transparent substrate according to a layer on the light-emitting side of the light-emitting element to reduce a reflectivity at an interface between the metasurface and the light-emitting element.

In one or more embodiments of the present disclosure, the light wavelength is a wavelength of visible light or near infrared light.

In one or more embodiments of the present disclosure, the peak of the transmittances is a peak of average transmittances of TE waves and TM waves of the light wavelength with respect to the phase compensation values.

An aspect of the present disclosure is related to a method of manufacturing a light-emitting device.

According to one or more embodiments of the present disclosure, a method of manufacturing a light-emitting device includes a number of operations. A light-emitting element is formed. A metasurface is formed, wherein the metasurface has a plurality of unit cells, each of the unit cells has a meta-atom rod corresponding to a phase compensation value, and the meta-atom rods have the same heights and different widths and the meta-atom rods have a periodicity of a supercell period length of the metasurface along a deflection direction, wherein the supercell period length is determined based on a determined deflection angle and a light wavelength of the light-emitting element. The metasurface is bonded on a light-emitting side of the light-emitting element.

In one or more embodiments of the present disclosure, the method further includes before the metasurface is bonded on the light-emitting side of the light-emitting element, a transmittance of the metasurface is detected.

In one or more embodiments of the present disclosure, the unit cells are periodically arranged in a hexagonal lattice.

In one or more embodiments of the present disclosure, each of the unit cells includes a meta-atom rod, and the meta-atom rods include a plurality of square rods or circle rods respectively inducing the phase compensation values of the unit cells. Forming the metasurface further includes adjusting a plurality of widths of the meta-atom rods so that the metasurface has a peak of transmittance of light wavelength with respect to the phase compensation values.

In one or more embodiments of the present disclosure, the light-emitting element includes a dielectric layer on the light-emitting side, and the metasurface includes a transparent substrate on which the meta-atom rods are located, wherein bonding the metasurface on the light-emitting side of the light-emitting element includes heterogeneously bonding a side of the transparent substrate opposite to the meta-atom rods on the dielectric layer of the light-emitting element, and the transparent substrate and the dielectric layer are selected to reduce a reflectivity at an interface between the transparent substrate of the metasurface and the dielectric layer of the light-emitting element.

An aspect of the present disclosure is related to a light-emitting device.

According to one or more embodiments of the present disclosure, a light-emitting device includes a light-emitting element and a metasurface. The light-emitting element includes a light-emitting side and has a light source with a light wavelength. The metasurface is located on a light-emitting side of the light-emitting element. The metasurface includes a plurality of unit cells periodically arranged with a supercell period length along a deflection direction. A plurality of supercells is defined by the supercell period length from the unit cells. Each of the supercells includes a first unit cell and a plurality of subordinate unit cells. The first unit cell has a first meta-atom rod corresponding to a first phase compensation value. The subordinate unit cells are arranged equidistantly along the deflection direction relative to the first unit cell. The subordinate unit cells have a plurality of subordinate phase compensation values increasing equally along the deflection direction with respect to the first unit cell. A difference of the first phase compensation value and any of the subordinate phase compensation values is less than 360 degrees. The first phase compensation value is configured to cause the metasurface to have a peak of transmittance relative to the light wavelength.

In one or more embodiments of the present disclosure, for each of the supercells, the first meta-atom rod of the first unit cell and the meta-atom rods of the subordinate unit cells have the same heights and different widths.

In one or more embodiments of the present disclosure, the metasurface further includes a transparent substrate. The meta-atom rods of the unit cells are formed on the transparent substrate. A side of the transparent substrate opposite to the meta-atom rods is heterogeneously bonded on the light-emitting side.

In one or more embodiments of the present disclosure, the light-emitting element includes a dielectric layer on the light-emitting side of the light-emitting element. The metasurface is bonded on the dielectric layer.

In one or more embodiments of the present disclosure, the unit cells are periodically arranged in a hexagonal lattice.

In one or more embodiments of the present disclosure, along the deflection direction, a width of each of the meta-atom rods is less a width of any of the unit cells.

In summary, according to one or more embodiments of the present disclosure, the phase compensation value of each unit cell in the supercell in the metasurface can be adjusted based on the determined deflection direction of the light, such that energy loss of the light emitted from the light-emitting element is reduced and the efficiency of the final integrated device is further improved.

It is to be understood that both the foregoing general description and the following detailed description are by examples, and are intended to provide further explanation of the disclosure as claimed.

BRIEF DESCRIPTION OF THE DRAWINGS

The advantages of the present disclosure are to be understood by the following exemplary embodiments and with reference to the attached drawings. The illustrations of the drawings are merely exemplary embodiments and are not to be considered as limiting the scope of the disclosure.

DETAILED DESCRIPTION

Figure 1B:
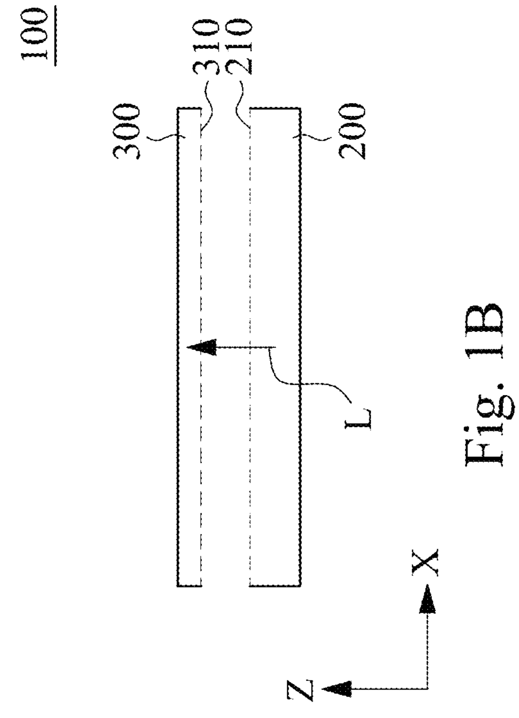
FIG. 1B illustrates a side view of FIG. 1A.

Reference will now be made in detail to the embodiments of the present disclosure, examples of which are illustrated in the accompanying drawings. Wherever possible, the same reference numbers are used in the drawings and the description to refer to the same or like parts.

In addition, terms used in the specification and the claims generally have the usual meaning as each terms are used in the field, in the context of the disclosure and in the context of the particular content unless particularly specified. Some terms used to describe the disclosure are to be discussed below or elsewhere in the specification to provide additional guidance related to the description of the disclosure to specialists in the art.

Phrases “first,” “second,” etc., are solely used to separate the descriptions of elements or operations with same technical terms, not intended to be the meaning of order or to limit the disclosure.

Secondly, phrases “comprising,” “includes,” “provided,” and the like, used in the context are all open-ended terms, i.e. including but not limited to.

Further, in the context, “a” and “the” can be generally referred to one or more unless the context particularly requires. It will be further understood that phrases “comprising,” “includes,” “provided,” and the like, used in the context indicate the characterization, region, integer, step, operation, element and/or component it stated, but not exclude descriptions it stated or additional one or more other characterizations, regions, integers, steps, operations, elements, components and/or groups thereof.

Figure 1A:
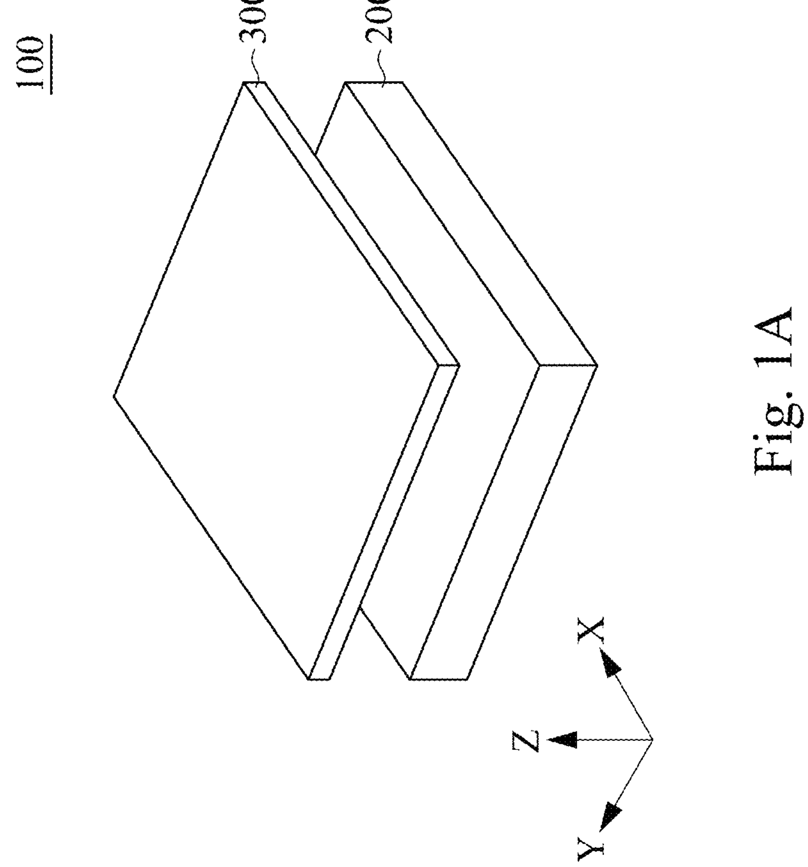
FIG. 1A illustrates a schematic exploded view of a light-emitting device according to one embodiment of the present disclosure.

Reference is made to FIGS. 1A and 1B. FIG. 1A illustrates a schematic exploded view of a light-emitting device 100 according to one embodiment of the present disclosure. FIG. 1B illustrates a side view of FIG. 1A.

As shown in FIGS. 1A and 1B, in one or more embodiments of the present disclosure, a light-emitting device 100 includes a light-emitting element 200 and a metasurface 300. The light-emitting element 200 includes a light-emitting side 210. The metasurface 300 is disposed on the light-emitting side 210 of the light-emitting element 200. For the purpose of simple description, some of elements of the light-emitting element 200 and the metasurface 300 are not shown in FIGS. 1A and 1B. Reference is made to the discussion below to further describe the detailed structure of the metasurface 300.

In FIG. 1B, light is emitted by the light-emitting element 200 from the light-emitting side 210 thereof. The light-emitting element 200 is configured to project the light L along a z direction, which corresponds to a stacking direction of the light-emitting element 200 and the metasurface 300. In some embodiments, the light-emitting element 200 includes a Vertical-Cavity-Surface-Emitting Laser (VCSEL), a Photonic-Crystal Surface-Emitting Laser (PCSEL) or a Resonant Cavity Light Emitting Diode (RCLED). In general, the light-emitting element 200 can include a plurality of layers of epitaxy structures, and a layer on the light-emitting side 210 of the light-emitting element 200 can be a dielectric material.

As shown in FIGS. 1A and 1B, in one or more embodiments of the present disclosure, the metasurface 300 includes a transparent substrate 310. The metasurface 300 can further have a plurality of meta-atoms disposed on the substrate 310. Reference is made to the discussion below for further details.

Figure 1C:
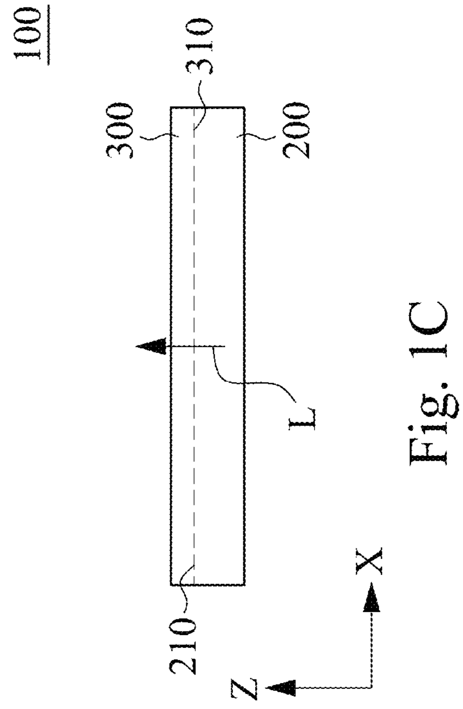
FIG. 1C illustrates a side view of a light-emitting device.

Reference is made to FIG. 1C. FIG. 1C illustrates a side view of a light-emitting device 100. In some embodiments, the substrate 310 of the metasurface 300 can be heterogeneously bonded to the light-emitting side 210 of the light-emitting element 200. The layer where the light-emitting side 210 of the light-emitting element 200 is located can be a dielectric material. Therefore, an appropriate material can be selected for the substrate 310 of the metasurface 300 to improve the light extraction efficiency of the integrated light-emitting device 100 (i.e., transmittance of the light emitted from the light-emitting element 200).

For example, in some embodiments, the metasurface 300 and the light-emitting element 200 are bonded at the interface using an adhesive. If the dielectric material layer on the light-emitting side 210 of the light-emitting element 200 is a dielectric material with refractive index $n_1$, a dielectric material with refractive index $n_2$ can be selected for the metasurface 300. For example, a dielectric material with refractive index $n_2$ can be used for the substrate 310 of the metasurface 300. The reflectivity R at the interface between the light-emitting element 200 and the metasurface 300 can be expressed as the following relation (1):

$$R = \left(\frac{n_1 - n_2}{n_1 + n_2}\right)^2$$

As such, in some embodiments, the metasurface 300 can be made of a dielectric material with a refractive index $n_2$ close to the refractive index $n_1$ to reduce the reflectivity R and improve the overall light output efficiency. In some embodiments, the substrate 310 of the metasurface 300 can be made of a dielectric material.

In some embodiments, the yield of the light-emitting element 200 and the metasurface 300 can be tested separately before bonding the metasurface 300 and the light-emitting element 200 to avoid defects in either of these elements that may affect the light output efficiency of the formed integrated light-emitting device 100. For example, inspection of the light-emitting element 200 can, for example, confirm the light emitting power consumption of the light-emitting element 200 or perform a stress test. In some embodiments, the metasurface 300 can be tested to confirm the transmittance of the metasurface 300 with respect to the wavelength of the light-emitting element 200, and whether the designed metasurface 300 functions as expected.

Figure 2A:
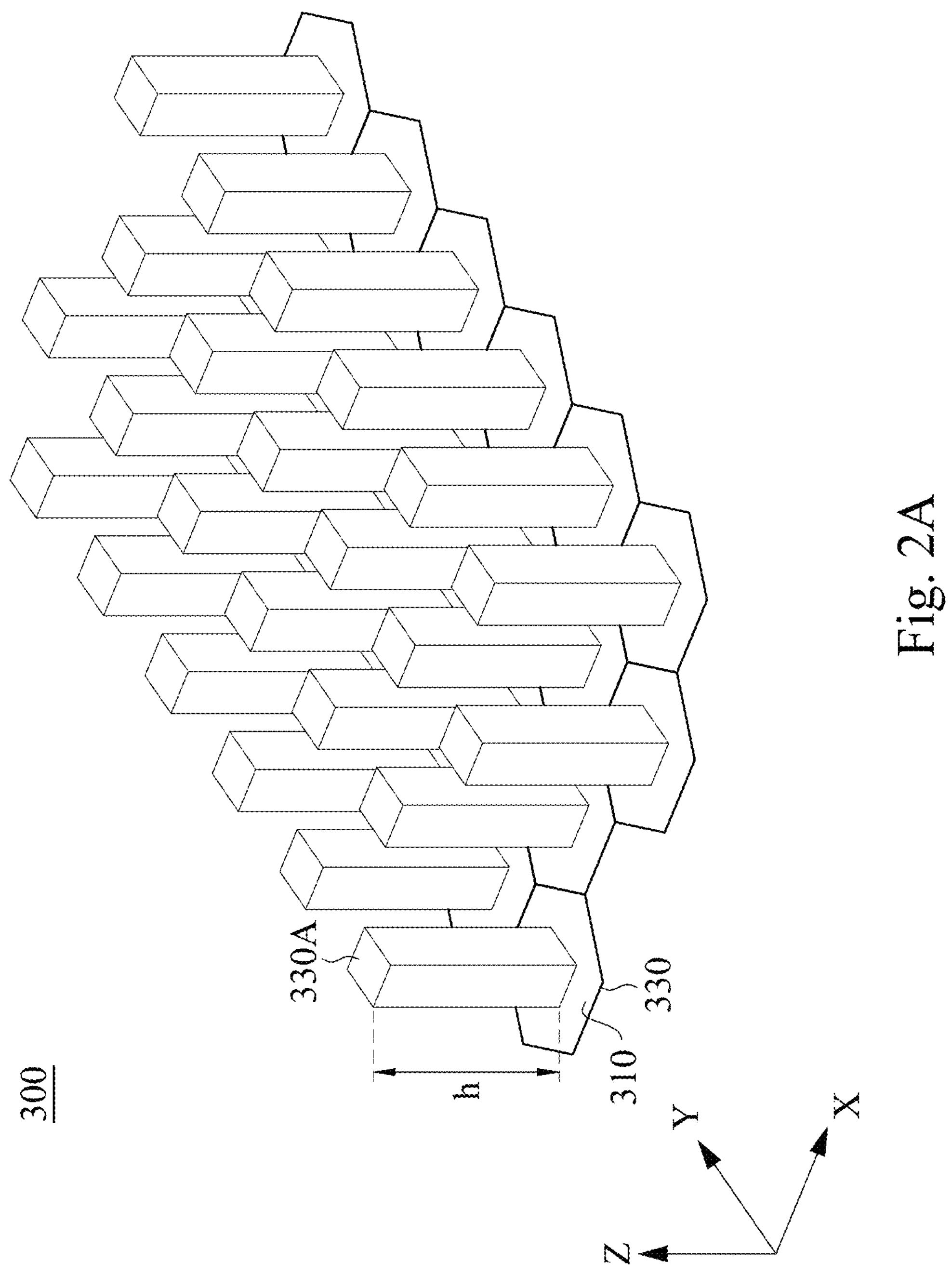
FIG. 2A illustrates a schematic perspective view of a metasurface according to one embodiment of the present disclosure.
Figure 2B:
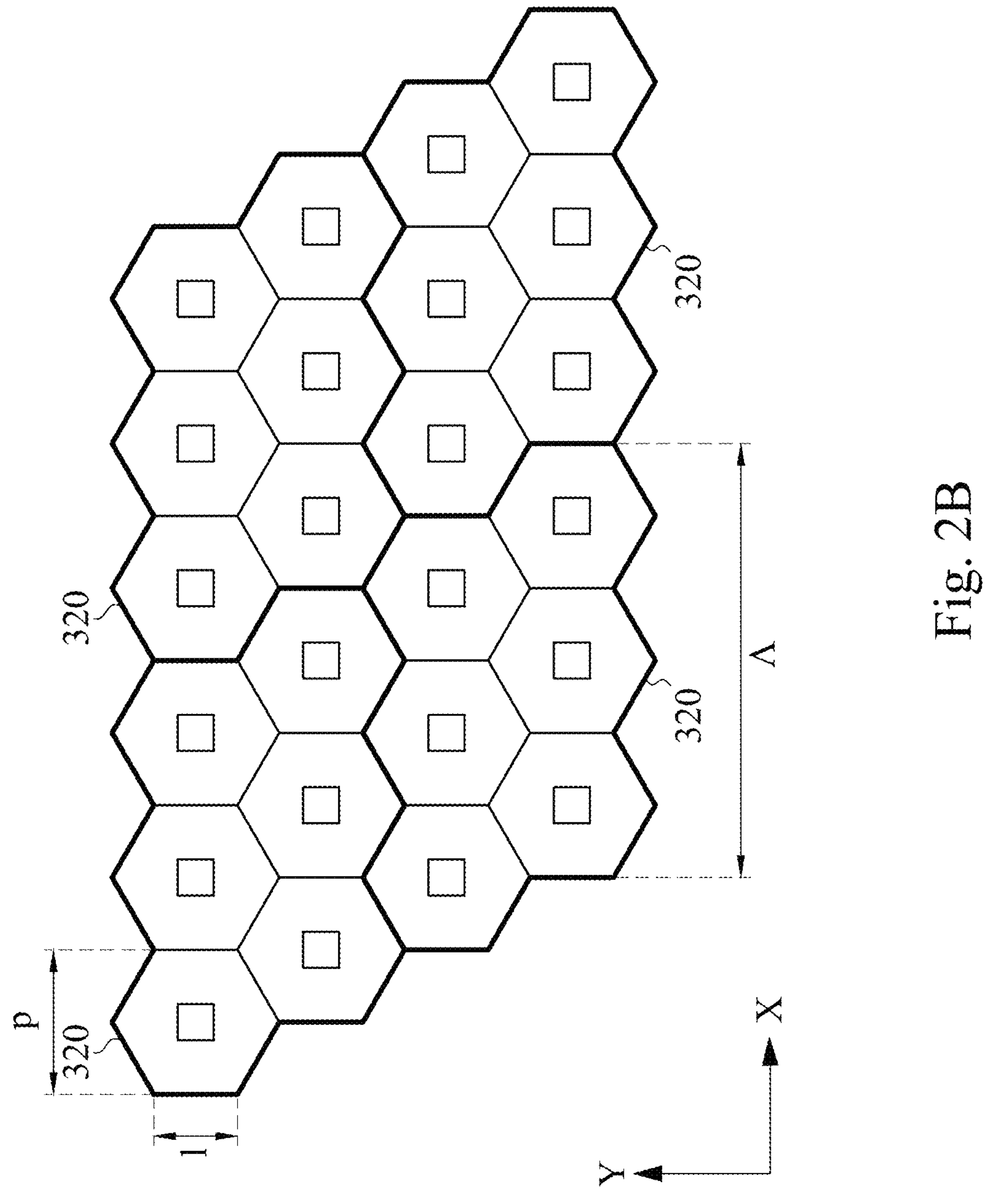
FIG. 2B illustrates a top view of FIG. 2A.

Reference is made to FIGS. 2A and 2B to further illustrate the metasurface 300. FIG. 2A illustrates a schematic perspective view of a metasurface 300 according to one embodiment of the present disclosure. FIG. 2B illustrates a top view of FIG. 2A.

FIG. 2A and FIG. 2B illustrate a portion of the metasurface 300. In FIG. 2A, the metasurface 300 includes a plurality of unit cells 330 arranged in a hexagonal lattice, and each of the unit cells 330 has a substrate 310 and a meta-atom rod 330A, which is placed on top of the substrate 310. In one or more embodiments of the present disclosure, the meta-atom rods 330A have the same heights h in the direction Z relative to the top surface of the substrate 310, as shown in FIG. 2A.

The hexagonal lattice arrangement can make the meta-atom rods 330A of the unit cells 330 conform to the basic principle of planar closest arrangement, so as to provide a higher density of the meta-atom rods 330A arrangement in the unit area of the metasurface 300 and enhance the controllability of the optical properties of the metasurface 300. Reference is made to the subsequent discussion for more details about the controllability of the optical properties of the metasurface 300.

Although the unit cells 330 are shown in the hexagonal lattice arrangement in FIG. 2A, in one or more embodiments of the present disclosure, the substrates 310 of the unit cells 330 are essentially connected together. In other words, in some embodiments of the present disclosure, when the metasurface 300 is formed, a single layer of substrate 310 covering a plurality of the unit cells 330 can be formed first, and then a plurality of meta-atom rods 330A can be arranged on the substrate 310, and a plurality of hexagonal unit cells 330 can be delineated according to the arrangement of meta-atom rods 330A, and there is no actual division on the substrate 310.

FIG. 2B illustrates the top view of FIG. 2A. In one or more embodiments of the present disclosure, a supercell period length Λ in the direction X can be defined. As such, in the direction X, a plurality of supercells 320 can be defined by the unit cells 330 by the supercell period length Λ, and the supercells 320 have a translational symmetry of the supercell period length Λ. In other words, the supercell period length Λ is capable of defining a plurality of substantially identical supercells 320 in the direction X. In the exemplary embodiments of the present disclosure, for example, in FIG. 2B, four substantially identical supercells 320 are defined by the twenty-four unit cells 330. For the sake of clarity, the edges of the supercells 320 are shown as thick lines.

Reference is made to FIGS. 2A and 2B again. In this embodiment, a shape of the unit cell 330 on the X-Y plane is a regular hexagon. Each of the regular hexagonal unit cells 330 has an edge length l, and each of the unit cells 330 has a unit cell length p in the direction X.

Figure 3B:
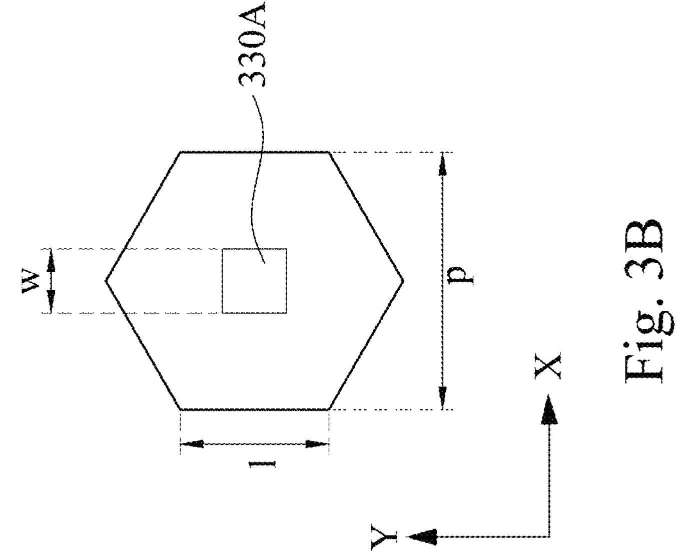
FIG. 3B illustrates a top view of FIG. 3A.
Figure 3A:
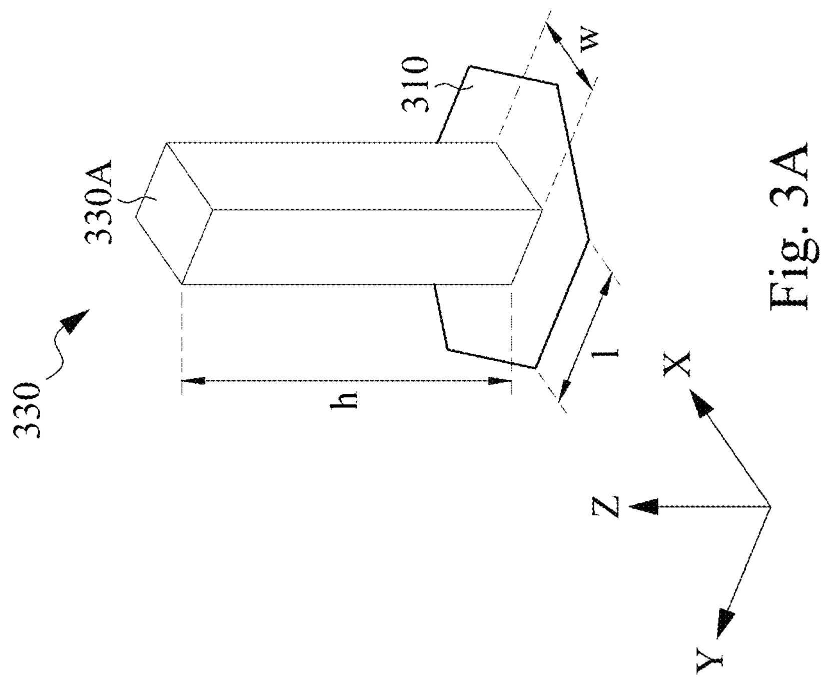
FIG. 3A illustrates a schematic perspective view of a unit cell of a metasurface according to one embodiment of the present disclosure.

Reference is made to FIG. 3A and FIG. 3B to further illustrate a structure of the unit cells 330. FIG. 3A illustrates a schematic perspective view of a unit cell 330 of a metasurface 300 according to one embodiment of the present disclosure. FIG. 3B illustrates a top view of FIG. 3A.

As shown in FIG. 3A, in some embodiments, the substrate 310 can be a transparent dielectric material, and the substrate 310 can be selected according to the material on the light-emitting side 210 of the light-emitting element 200 to reduce the reflectivity occurring at the interface between the metasurface 300 and the light-emitting element 200. The substrate 310 can be a transparent dielectric material.

Referring to FIGS. 2A-3B. In the exemplary embodiments disclosed herein, each of these supercells 320 has a supercell period length Λ in the direction X, and each of the supercells 320 has six unit cells 330. In other embodiments, each of the supercells 320 may contain a plurality of unit cells 330 greater than six or less than six.

In this embodiment, the meta-atom rods 330A are square columns. As shown in FIG. 3B, the shape of each of the meta-atom rods 330A is square when viewed from the top of the meta-atom rods 330A facing the X-Y plane. Each of the meta-atom rods 330A is placed in the center of the corresponding one of the hexagonal unit cells 330. In FIG. 3B, each of the unit cells 330 has a unit cell length p in the direction X and each of the meta-atom rods 330A has a width w in the direction X. The width w of each of the meta-atom rods 330A is limited by the edge length l of the hexagonal unit cell 330 and the unit cell length p.

For example, as shown in FIG. 3B, each of the meta-atom rods 330A is at most an inner square of a regular hexagonal unit cell 330, otherwise the meta-atom rods 330A would be out of the range of a single unit cell 330. In some embodiments of the present disclosure, the unit cell length p of the hexagonal unit cell 330 is, for example, 330 nm, corresponding to a width w of each of the meta-atom rods 330A up to about 230 nm.

The width w of each of the meta-atom rods 330A affects the phase compensation value for the corresponding unit cell 330. Generally, as shown in FIG. 1B, the light-emitting element 200 emits light L in the direction Z, which passes through the substrate 310 and enters the metasurface 300. Referring again to FIG. 3A, the light L will pass through the meta-atom rods 330A. The meta-atom rods 330A can be considered as a plurality of waveguides. As the light L travels through the meta-atom rods 330A, each of the meta-atom rods 330A has a different effect on the light L, resulting in a different phase retardation. By adjusting the width of the meta-atom rods 330A, the phase compensation value of the metasurface 300 can be adjusted in different localities.

Furthermore, as shown in FIG. 3A, in the present embodiment, each of the meta-atom rods 330A has a height h in the direction Z. In some embodiments, the height h of each of the meta-atom rods 330A will affect the phase compensation value provided for the light L.

In the exemplary embodiment of the present disclosure, the meta-atom rods 330A in the metasurface 300 have the same heights h. Therefore, the phase compensation value provided by the unit cells 330 can be changed by adjusting the width w of the meta-atom rods 330A.

In some embodiments of the present disclosure, the height h of each of the meta-atom rods 330A is 800 nm. However, it is to be noted that this is merely an embodiment of the present disclosure, and the present disclosure should not be limited by this embodiment.

In some embodiments, the material of the meta-atom rods 330A includes a metallic material. In some embodiments, the metal material of the meta-atom rods 330A can be selected to respond to light L in visible light and near and mid-infrared wavelengths.

Figure 4:
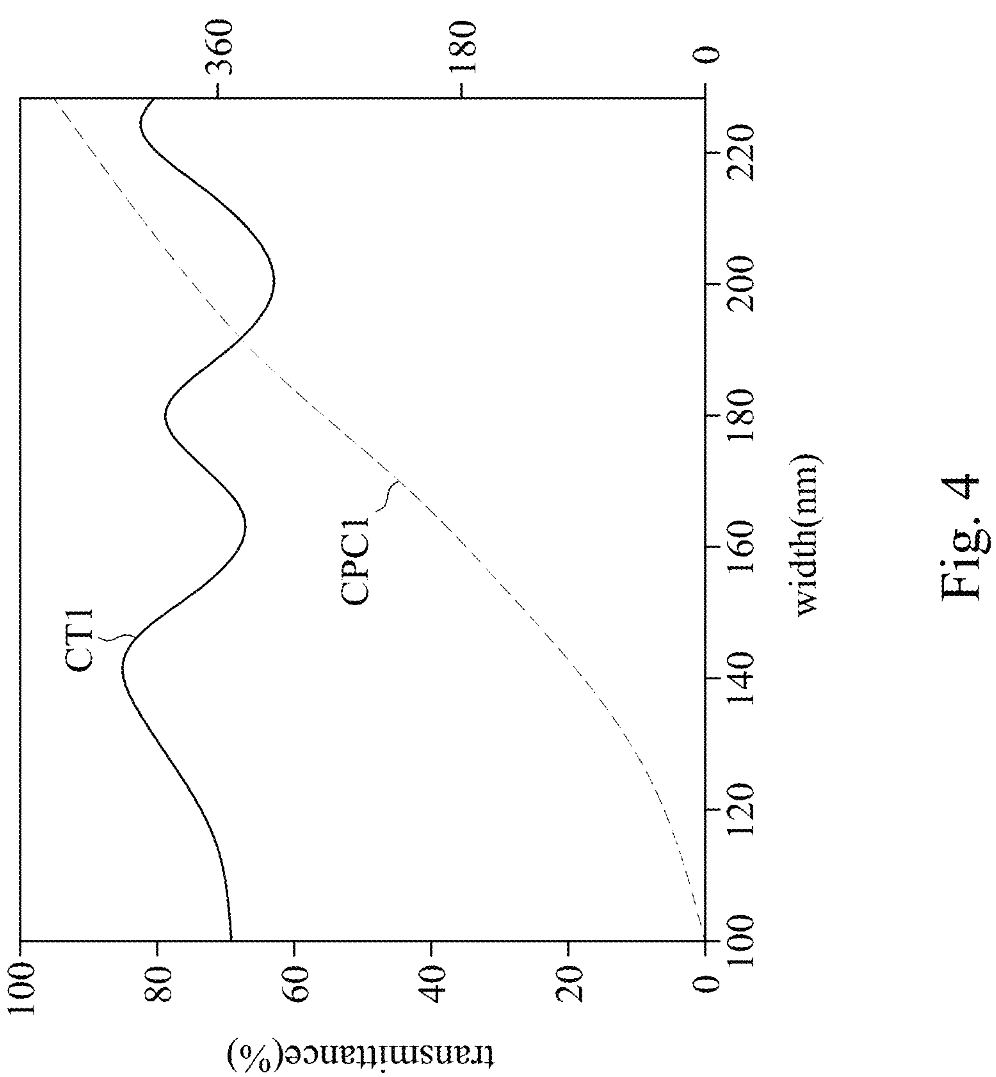
FIG. 4 is a diagram illustrating the relationship of transmittance and phase compensation values with respect to different widths of a meta-atom rod of the unit cells according to one embodiment of the present disclosure.

Reference is made to FIG. 4. FIG. 4 is a diagram illustrating the relationship of transmittance and phase compensation values with respect to widths w of one of the meta-atom rods 330A in one of the unit cells 330 in FIG. 3A according to one embodiment of the present disclosure.

In the exemplary embodiment of the present disclosure, each of the meta-atom rods 330A is a square column and has a height h of 800 nm. As an illustrative embodiment, when a light L with a selected wavelength of 940 nm passes through the unit cell 330 including a meta-atom rod 330A, the transmission rate (transmittance, or light transmission rate) of the light L at different widths w of the meta-atom rod 330A is shown in FIG. 4.

In the exemplary embodiment of the present disclosure, the unit cell 330 is a regular hexagonal shape with a unit cell length p of 330 nm. As shown in FIG. 4, the horizontal axis is the different widths w of the regulating meta-atom rods 330A in nm, the left vertical axis is the transmittance in percent (%), and the right vertical axis is the phase compensation value in degrees that the unit cell 330 can provide. The curve CT1 is the curve of the different widths w of one of the meta-atom rods 330A of the unit cells 330 in relation to the corresponding transmittances corresponding to the left vertical axis. The curve CPC1 is the curve of the different widths w of one of the meta-atom rods 330A of the unit cells 330 in relation to the phase compensation value corresponding to the right vertical axis.

Thus, from the curve CPC1 in FIG. 4, the phase compensation value generated by the unit cell 330 can range from 0 degrees to more than 360 degrees using a meta-atom rod 330A with a width w of 100 nm to nearly 230 nm in the unit cell length p of the hexagonal unit cell 330, wherein the meta-atom rod 330A with a width w of 100 nm is used as a reference for the phase compensation value of 0. It should be noted that a meta-atom rod 330A with a width w of 100 nm is used as the reference for a phase compensation value of 0. In one or more embodiments of the present disclosure, a phase compensation value of 0 means that the light L entering a meta-atom rod 330A has the same phase as the light L leaving the meta-atom rod 330A.

In this embodiment, since the width w of the meta-atom rod 330A is limited by the unit cell length p, the maximum value of the width w can be 230 nm for a unit cell length p of 330 nm, which results in an upper limit of the phase compensation value that can be provided by the unit cell 330. As shown in FIG. 4, the upper limit of the phase compensation value that can be provided by the unit cell 330 is about 481.5 degrees when the width w of the meta-atom rod 330A is close to 230 nm.

On the other hand, from the curve CT1 in FIG. 4, in the case of a unit cell length p of 330 nm in the hexagonal unit cell 330, a meta-atom rod 330A with a greater size does not mean that the corresponding transmittance can be greater. For example, the transmittance of the unit cell 330 has a local peak at the width w of the meta-atom rod 330A, which is close to 140 nm, and close to 180 nm.

Since there is a certain degree of freedom in the selection of the phase compensation value, it is possible to improve the overall light output efficiency of the light-emitting device 100 integrating the metasurface 300 by designing the width w of the meta-atom rod 330A in each unit cell 330 in the metasurface 300.

In some embodiments, the relationship diagram in FIG. 4 can be obtained by a computer simulation. For example, in the case of a particular material and geometry, a physical model of the unit cell 330 including the substrate 310 and the meta-atom rod 330A can be established by a computer, the light L with the light wavelength can be set and the width w of the meta-atom rod 330A can be adjusted to calculate the relationship graph as shown in FIG. 4. In some embodiments, a database can be established for different light wavelengths of light L, the different heights h of a meta-atom rod 330A, and/or the different unit cell lengths p of the unit cell 330, so that the relationship diagram similar to the one in FIG. 4 can be quickly extracted when different metasurfaces 300 are designed.

Figure 5B:
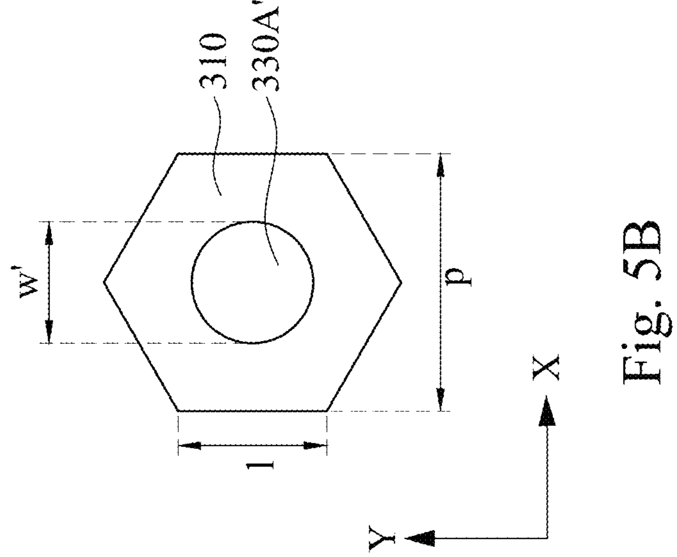
FIG. 5B illustrates a top view of FIG. 5A.
Figure 5A:
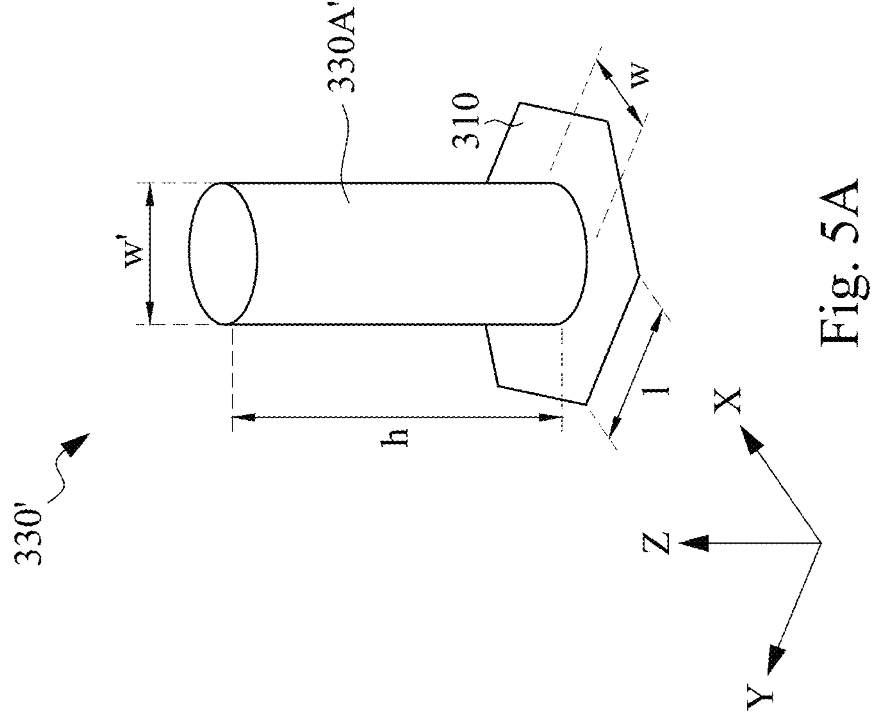
FIG. 5A illustrates a schematic perspective view of a unit cell of a metasurface according to one embodiment of the present disclosure.

Reference is made to FIG. 5A and FIG. 5B. FIG. 5A illustrates a schematic perspective view of a unit cell of a metasurface 300 according to one embodiment of the present disclosure. FIG. 5B illustrates a top view of FIG. 5A.

It is noted that to simplify the description, FIG. 5A and FIG. 5B apply similar labeling to that used in FIG. 3A and FIG. 3B to indicate similar components.

In some exemplary embodiments of the present disclosure, a cylinder may be used as a meta-atom rod. Specifically, reference is made to the exemplary unit cell 330' illustrated in FIGS. 5A and 5B. Different from the meta-atom rod 330A in FIG. 3A, each of the hexagonal unit cells 330' shown in FIG. 5A has a meta-atom rod 330A', which is a cylinder pillar set in the center of the hexagonal unit cell 330'. In some embodiments of the present disclosure, the meta-atom rod 330A' is disposed on the substrate 310. As mentioned above, the substrate 310 may be a material used to reduce the reflectivity of the interface with the light-emitting element 200.

In some embodiments of the present disclosure, similar to the configuration of FIGS. 3A and 3B, in FIGS. 5A and 5B, the unit cell 330 is a square hexagon having an edge length l, and the unit cell 330' has a unit cell length p in the direction X. The unit cell length p of the unit cell 330' is, for example, 330 nm. In addition, in FIG. 5A, each of the meta-atom rods 330A' has a height h in the direction Z. In some embodiments, the height h of each of the meta-atom rods 330A' is, for example, 800 nm.

As shown in FIG. 5A and FIG. 5B, each of the meta-atom rods 330A' has a width w' in the direction X. Since each of the meta-atom rods 330A' is set in the center of the corresponding hexagonal unit cell 330', the width w' of each meta-atom rod 330A' corresponds to the diameter of the meta-atom rod 330A'. Similar to the previous meta-atom rods 330A, the width w' of each meta-atom rod 330A' is also limited by the unit cell length p of the unit cell 330'. The meta-atom rod 330A' is at most one of the largest inner junction circles of the hexagonal unit cell 330'. For example, if the unit cell length p of the unit cell 330' is 330 nm, the width w' of the meta-atom rod 330A' is at most 330 nm, otherwise the meta-atom rod 330A' will be extended beyond the range of the unit cell 330'.

Figure 6:
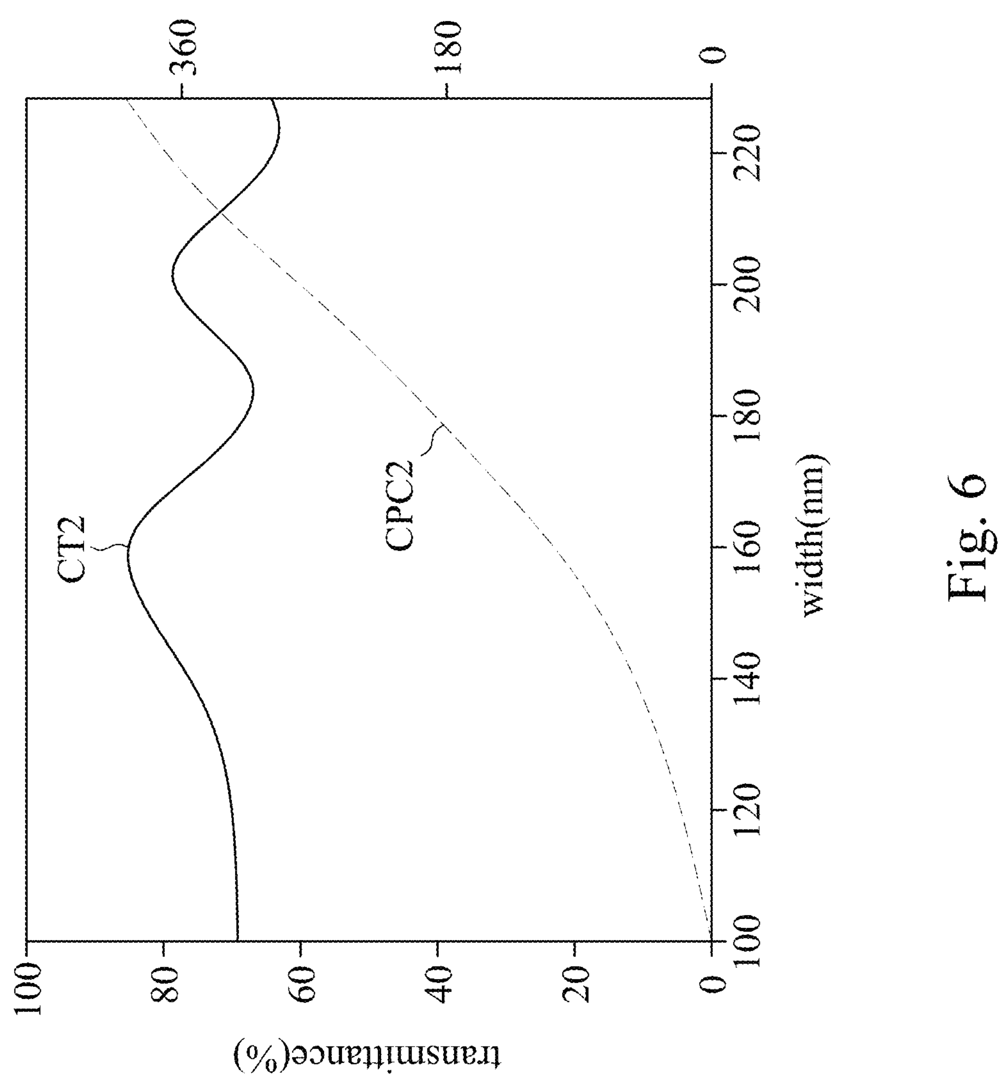
FIG. 6 is a diagram illustrating the relationship of transmittance and phase compensation values with respect to different widths of a meta-atom of the unit cells in FIG. 5A according to one embodiment of the present disclosure.

Reference is now made to FIG. 6. FIG. 6 is a diagram illustrating the relationship of transmittance and phase compensation values with respect to widths w of a meta-atom 330A' of the unit cells 330' in FIG. 5A according to one embodiment of the present disclosure.

In the exemplary embodiment of FIG. 6, the unit cell 330' has a unit cell length p of 330 nm, and the meta-atom rod 330A' is a cylinder having a height h of 800 nm. As an illustrated embodiment, FIG. 6 shows the transmittance of the unit cell 330' relative to the light L when a light L with a wavelength of 940 nm is selected to pass through the unit cell 330' and the phase compensation value that can be provided when the width of the meta-atom rod 330A' is adjusted.

Similar to FIG. 4, in FIG. 6, the horizontal axis is the different widths w' of the modulated meta-atom rod 330A' in nm, the left vertical axis is the transmittance of the light L in percent (%), and the right vertical axis is the phase compensation value that the unit cell 330' can provide in degrees. The curve CT2 is the curve of different widths w and corresponding transmittance of the meta-atom rod 330A' of the unit cell 330', and the values of the curve CT2 correspond to the left vertical axis. The curve CPC2 is the curve of different widths w and phase compensation of the meta-atom rod 330A' of the unit cell 330', and the phase compensation values of the curve CPC2 correspond to the right vertical axis.

Therefore, from the curve CPC2 in FIG. 6, the phase compensation values generated by the unit cell 330' can cover the range from 0 degrees to more than 360 degrees when the width w' of the cylindrical meta-atom rod 330A' is in the range of 100 nm to nearly 230 nm. The phase compensation value of the meta-atom rod 330A with a width w of 100 nm is used as a reference for a phase compensation value of 0. In addition, the meta-atom rod 330A' has a peak of the transmittances at widths w' near 160 nm and near 200 nm.

In some embodiments, similar to FIG. 4, the relationship diagram in FIG. 6 can be obtained by a computer simulation. For example, in the case of a particular material and geometry, a physical model of the unit cell 330' including the substrate 310 and the meta-atom rod 330A' can be established by a computer, the light L with the light wavelength can be set and the width w of the meta-atom rod 330A' can be adjusted to calculate the relationship graph as shown in FIG. 6. In some embodiments, a database can be established for different light wavelengths of light L, the different heights h of a meta-atom rod 330A', and/or the different unit cell lengths p of the unit cell 330', so that the relationship diagram similar to the one in FIG. 6 can be quickly extracted when different metasurfaces 300 are designed.

In some embodiments of the present disclosure, a metasurface 300 as shown in FIG. 3A can be formed by a unit cell 330 having a square meta-atom rod 330A in FIG. 3A. In some embodiments of the present disclosure, the unit cell 330 of the metasurface 300 in FIG. 2A can be replaced with a unit cell 330' in FIG. 5A, i.e., the metasurface 300 can also be formed by the unit cell 330' as in FIG. 5A, so that the formed metasurface 300 can satisfy the symmetry of translation along the supercell period length Λ in the direction X.

Figure 7B:
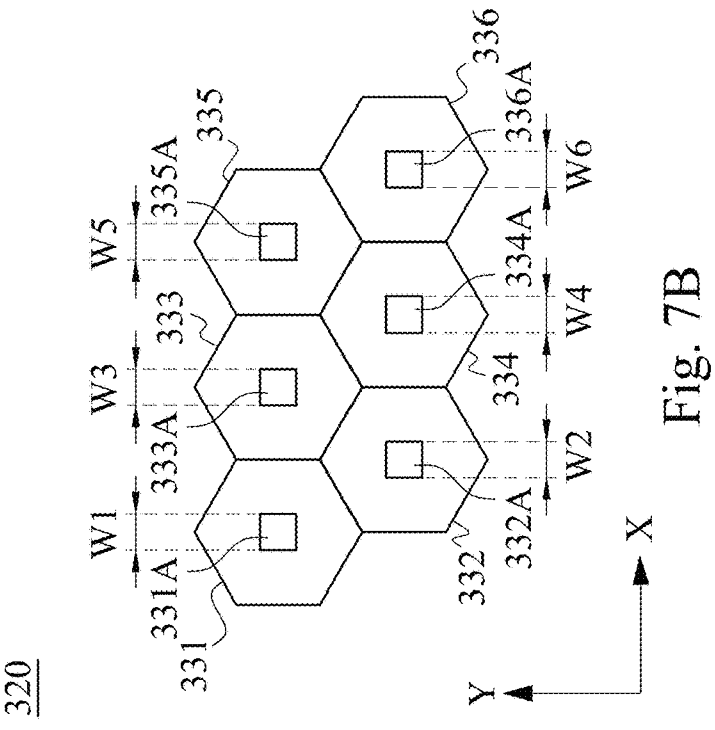
FIG. 7B illustrates a top view of FIG. 7A.
Figure 7A:
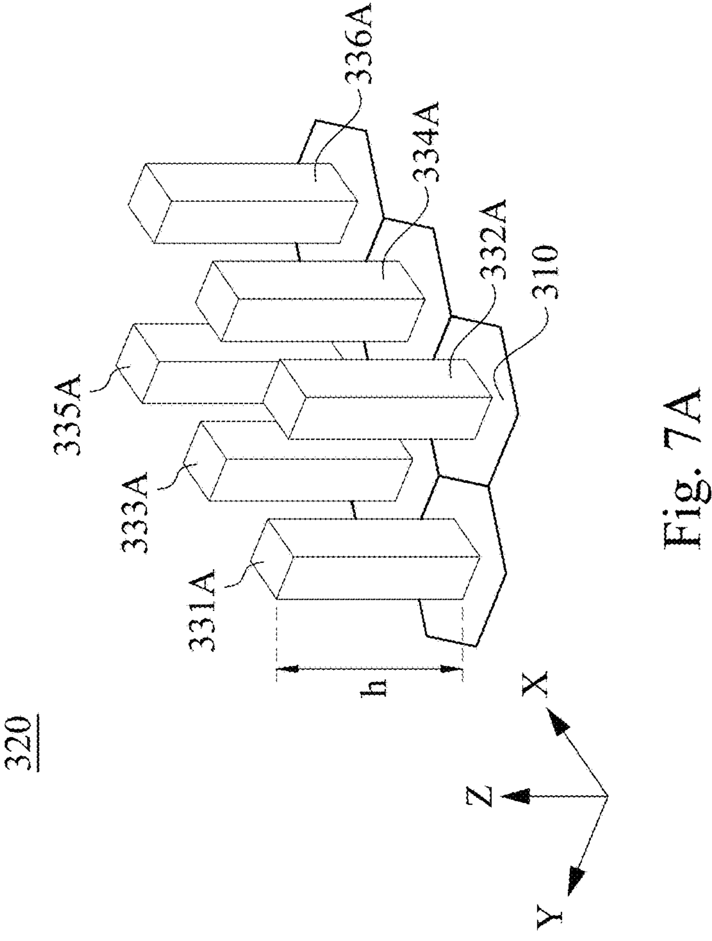
FIG. 7A illustrates a schematic perspective view of a supercell of a metasurface according to one embodiment of the present disclosure.

Reference is made to FIG. 2A again to further illustrate combinations of the metasurface 300 and is made also to FIGS. 7A and 7B. FIG. 7A illustrates a schematic perspective view of a supercell 320 of a metasurface 300 according to one embodiment of the present disclosure. FIG. 7B illustrates a top view of FIG. 7A.

In this embodiment, the metasurface 300 may be formed by a plurality of supercells 320 arranged periodically as shown in FIG. 2A. One of the supercells 320 may be included within a supercell periodic length Λ in the direction X. For the composition of the specific supercell 320, reference is made to FIG. 7A.

As shown in FIG. 7A and FIG. 7B, in this embodiment, the supercell 320 includes a unit cell 331, a unit cell 332, a unit cell 333, a unit cell 334, a unit cell 335, and a unit cell 336, wherein the unit cell 331, the unit cell 332, the unit cell 333, the unit cell 334, the unit cell 335, and the unit cell 336 respectfully include a meta-atom rod 331A, a meta-atom rod 332A, a meta-atom rod 333A, a meta-atom rod 334A, a meta-atom rod 335A and a meta-atom rod 336A having the same heights h.

Further, in one or more embodiments according to the present disclosure, the meta-atom rod 331A, the meta-atom rod 332A, the meta-atom rod 333A, the meta-atom rod 334A, the meta-atom rod 335A and the meta-atom rod 336A are square columns as shown in FIG. 7B. In this embodiment, the meta-atom rod 331A has a width W1, the meta-atom rod 332A has a width W2, the meta-atom rod 333A has a width W3, the meta-atom rod 334A has a width W4, the meta-atom rod 335A has a width W5 and the meta-atom rod 336A has a width W6. In this embodiment, the meta-atom rod 331A, the meta-atom rod 333A, the meta-atom rod 334A, the meta-atom rod 335A and the meta-atom rod 336A can be provided in the supercell 320 with different widths W1, W2, W3, W4, W5 and W6, respectively, to control the light L emitted from light-emitting element 200.

Figure 9:
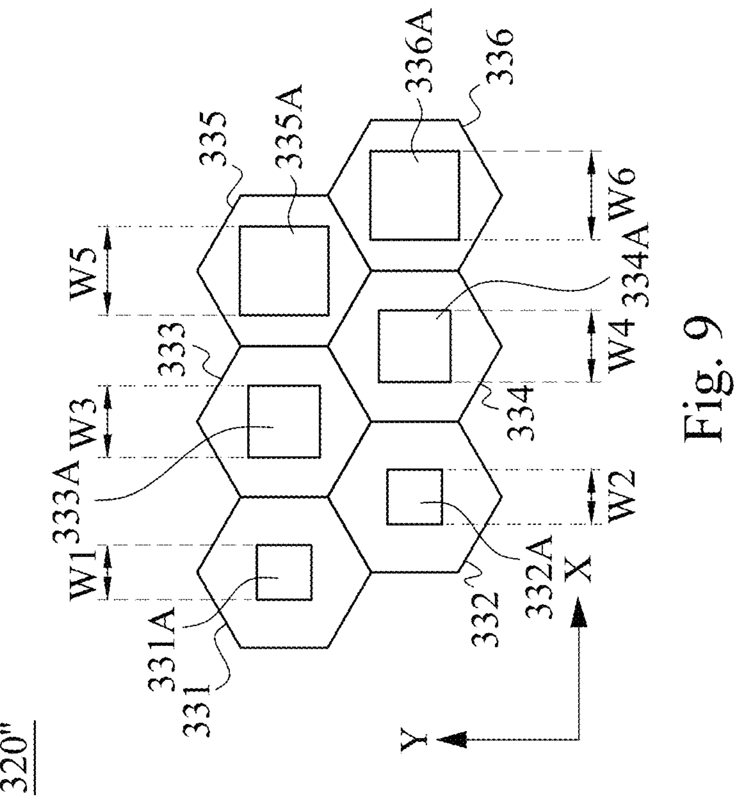
FIG. 8 and FIG. 9 illustrate schematic diagrams of adjusting the widths of the meta-atom rods in FIG. 7B, respectively.
Figure 8:
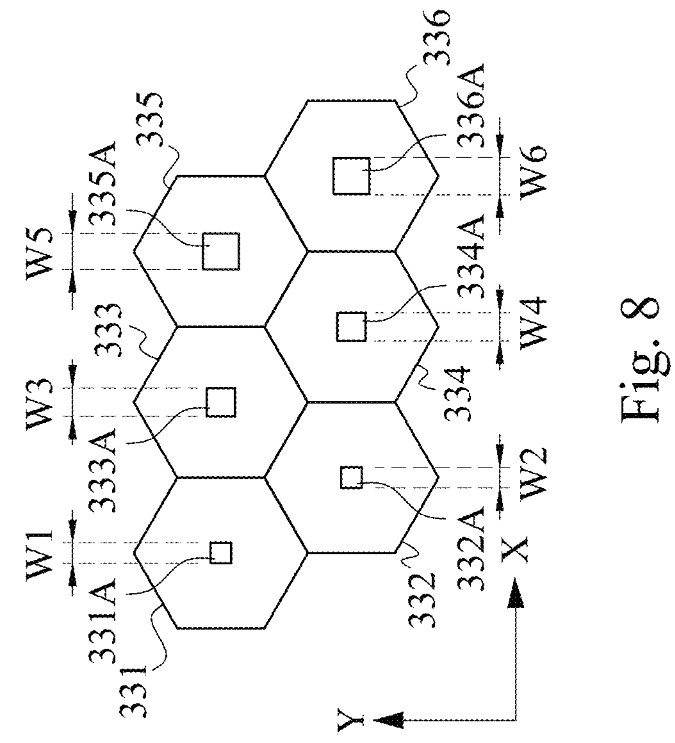

Reference is made to FIG. 8 and FIG. 9 to provide more details. FIG. 8 and FIG. 9 illustrate schematic diagrams of adjusting the widths of the meta-atom rods in FIG. 7B. In the embodiment of FIG. 8 and FIG. 9, increasing the width W1, the width W2, the width W3, the width W4, the width W5 and the width W6 along the direction X will make it possible to deflect the light L in the direction X.

Reference is made again to FIG. 4. As shown in FIG. 4, in a unit cell 330 having a square column meta-atom rod 330A, the phase compensation value that can be provided by the corresponding unit cell 330 can be adjusted by adjusting the width w of the meta-atom rod 330A while fixing the meta-atom rod 330A. Moreover, as the width w increases, the phase compensation value that can be provided by the unit cell 330 increases, and the width w is positively correlated with the phase compensation value.

Therefore, referring back to FIG. 8, the width W1, the width W2, the width W3, the width W4, the width W5, and the width W6 increase in the order of the direction X, so that the phase compensation values that can be provided by the unit cell 331, the unit cell 332, the unit cell 333, the unit cell 334, the unit cell 335, and the unit cell 336 also increase along the X direction. As such, when the light L passes through the supercell 320 of the metasurface 300, the light L gets the least phase compensation value in the unit cell 331 and the least delay, while the light L gets the most phase compensation value in the unit cell 336 and the most delay, resulting in the light L eventually bending in the direction X.

In some embodiments, the deflection angle θ at which the light L is deflected toward the direction X with respect to the direction Z can be expressed as the following relation (2):

$$\theta = \sin^{-1}\left(\frac{\lambda}{\Lambda}\right)$$

where λ of the relation (2) is the wavelength of the light L, and Λ of the relation (2) is the supercell period length Λ of the metasurface 300.

For a single supercell 320, the phase compensation values provided by the unit cell 331, the unit cell 332, the unit cell 333, the unit cell 334, the unit cell 335 and the unit cell 336, respectively, can be expressed as the following relation (3):

$$\Phi_g(x) = \frac{2\pi}{\lambda} x \sin\theta + \delta_g$$

where x is the position of the unit cell in the direction, $\phi_g(x)$ is the phase compensation value to be provided by the supercell 320 at different positions x, and $\delta_g$ is a modifiable phase degree of freedom, wherein different markers g corresponding to different $\delta_g$.

In this embodiment, the unit cell 331, the unit cell 332, the unit cell 333, the unit cell 334, the unit cell 335 and the unit cell 336 are arranged in a hexagonal lattice, so that the meta-atom rods 331A, the meta-atom rods 332A, the meta-atom rods 333A, the meta-atom rods 334A, the meta-atom rods 335A and the meta-atom rods 336A are arranged equally spaced along the direction X. The unit cell length p is equal to one-third of the supercell period length ∧. Thus, if the location of the meta-atom rod 331A is set to x=0, the location of the meta-atom rod 332A is x=∧/6, the location of the meta-atom rod 333A is x=2∧/6, the location of the meta-atom rod 333A is x=3∧/6, the location of the meta-atom rod 334A is x=4∧/6, the location of the meta-atom rod 334A is x=4∧/6, the location of the meta-atom rod 335A is x=5∧/6 and the location of the meta-atom rod 336A is x=6∧/6∧=. For example, a position difference between the two immediate-adjacent meta-atom rods 331A and 332A in the direction X are located ∧6=p/2.

Applying the above position information into the relation (3), it can be obtained that the unit cell 331 has a phase compensation value of 0 degrees+$\delta_g$ degrees, the unit cell 332 has a phase compensation value of 60 degrees+$\delta_g$ degrees, the unit cell 333 has a phase compensation value of 120 degrees+$\delta_g$ degrees, the unit cell 334 has a phase compensation value of 180 degrees+$\delta_g$ degrees, the unit cell 335 has a phase compensation value of 240 degrees+$\delta_g$ degrees, and the unit cell 336 has a phase compensation value of 300 degrees+$\delta_g$ degrees. After determining the phase compensation values of the unit cell 331, the unit cell 332, the unit cell 333, the unit cell 334, the unit cell 335 and the unit cell 336, it is possible to obtain that the width W1, the width W2, the width W3, the width W4, the width W5, and the width W6 are required for the meta-atom rod 332A, the meta-atom rod 333A, the meta-atom rod 334A, the meta-atom rod 335A, and the meta-atom rod 336A, respectively, directly by querying the curve CPC1 of the width w and phase compensation value of the square column meta-atom rod 330A in FIG. 4

As mentioned above, the unit cell 336 has the longest width W6 compared to the other meta-atom rods (e.g., the meta-atom rod 331A, meta-atom rod 332A, the meta-atom rod 333A, the meta-atom rod 334A and the meta-atom rod 335A) in the supercell 320. Referring to FIG. 4 above, it can be seen that the width W6 of the unit cell 336 can be up to 230 nm, making the phase compensation value of the unit cell 336 300 degrees+$\delta_g$ degrees up to 481.5 degrees. In this way, the range of $\delta_g$ can be between 0 and 180 degrees.

From another point of view, when the phase compensation values that the unit cell 331, the unit cell 332, the unit cell 333, the unit cell 334, the unit cell 335 and the unit cell 336 is determined, the unit cell 331 has a phase compensation value of $\delta_g$ degrees, and compared to the phase compensation value $\delta_g$ degrees of the unit cell 331, the unit cell 332, the unit cell 333, the unit cell 334, the unit cell 335 and the unit cell 336 have phase compensation values of 60 degrees+$\delta_g$ degrees, 120 degrees+$\delta_g$ degrees, 180 degrees+$\delta_g$ degrees, 240 degrees+$\delta_g$ degrees, and 300 degrees+$\delta_g$ degrees, respectively. That is, when designing the supercell 320, it is possible to first set the position of the unit cell 331 and select the phase compensation value δg degree of the unit cell 331, and then arrange the unit cell 332, the unit cell 333, the unit cell 334, the unit cell 335, and the unit cell 336 in the order of increasing phase compensation value with equal difference in the direction X. The unit cell 332, the unit cell 333, the unit cell 334, the unit cell 335, and the unit cell 336 can be considered as subordinate unit cells set relative to unit cell 331.

Therefore, by regulating the phase compensation value of the unit cell 331, the phase compensation values of the unit cell 332, the unit cell 333, the unit cell 334, the unit cell 335 and the unit cell 336 can be regulated accordingly. It should be noted that regulating the unit cell 331, the unit cell 332, the unit cell 333, the unit cell 334, the unit cell 335 and the unit cell 336 corresponds to regulating the width W1 of the meta-atom rod 331A, the width W2 of the meta-atom rod 332A, the width W3 of the meta-atom rod 333A, the width W4 of the meta-atom rod 334A, the width W5 of the meta-atom rod 335A and the width W6 of meta-atom rod 335A, respectively.

In addition, as shown in FIG. 4, since the width w of the meta-atom rod 330A is not positively correlated with the transmittance of light L, the phase compensation value $\delta_g$ of the unit cell 331 is adjusted, the phase compensation values of the unit cell 332, the unit cell 333, the unit cell 334, the unit cell 335, and the unit cell 336 are generated, and a simulation of the transmittance of the metasurface 300 with respect to the light L can be performed so as to induce a peak of the transmittance of the metasurface 300 and improve an efficiency of the integrated light-emitting device 100.

Reference is made to FIGS. 8 and 9 again. FIGS. 8 and 9 illustrate two embodiments of the unit cell 331 with different phase compensation values $\delta_g$ degrees, respectively.

In the supercell 320' shown in FIG. 8, g=0, the unit cell 331 provides a phase compensation value of 50 degree=0 degree. In this condition, the width W1 of the unit cell 331 is 100 nm with reference to the curve CPC1 in FIG. 4. Relative to the unit cell 331, the unit cell 332 has a phase compensation value of 60 degrees+$\delta_0$ degrees=60 degrees, the unit cell 333 has a phase compensation value of 120 degrees+$\delta_0$ degrees=120 degrees, the unit cell 334 has a phase compensation value of 180 degrees+$\delta_0$ degrees=180 degrees, the unit cell 335 has a phase compensation value of 240 degrees+$\delta_0$ degrees 240 degrees and the unit cell 336 has a phase compensation value of 300 degrees+$\delta_0$ degrees=300 degrees. Based on the determination of the phase compensation values of the unit cell 332, the unit cell 333, the unit cell 334, the unit cell 335 and the unit cell 336, the width W2 of the meta-atom rod 332A, the width W3 of the meta-atom rod 333A, the width W4 of the meta-atom rod 334A, the W5 of the meta-atom rod 335A and the width W6 of the meta-atom rod 336A can be obtained from the curve CPC1 in FIG. 4.

Figure 10:
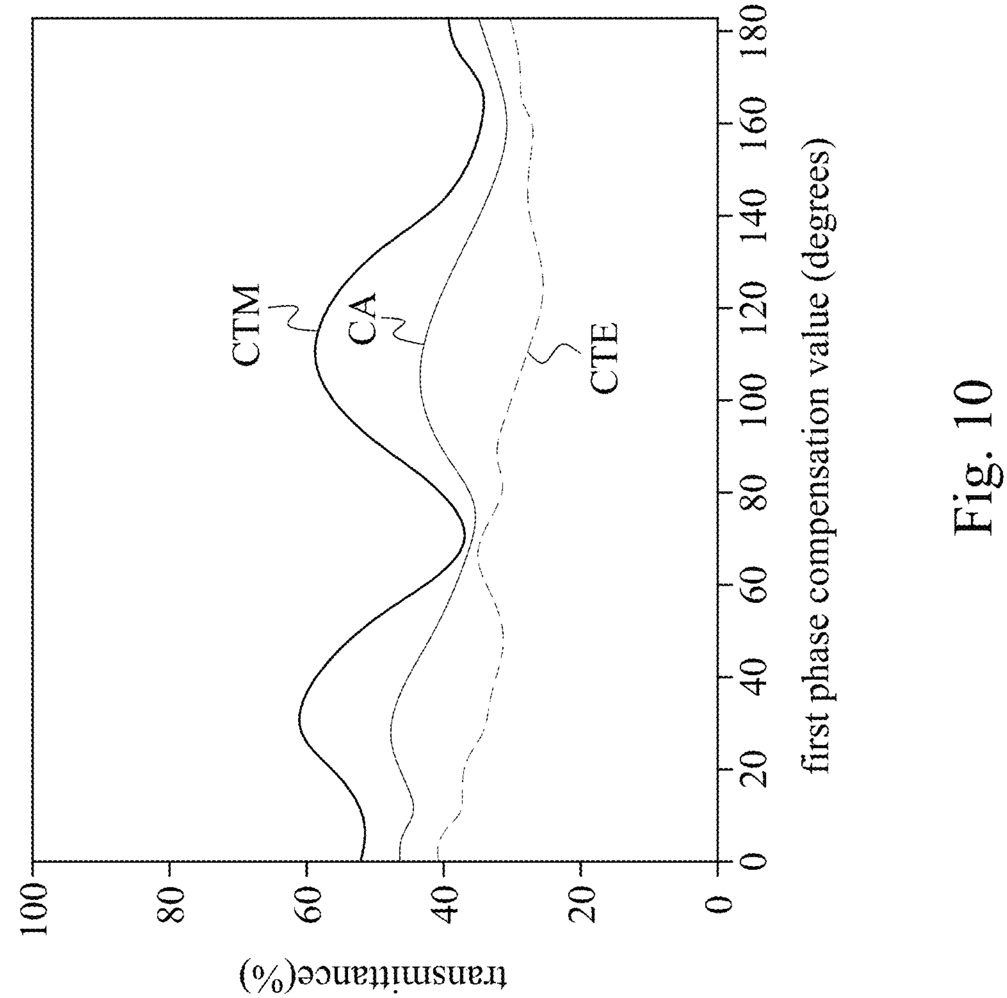
FIG. 10 is a diagram illustrating the relationship of the transmittance with respect to the adjusted first phase compensation values of the first unit cell in the supercell according to one embodiment of the present disclosure.

Therefore, the transmittances that the light L with light wavelength passes away the metasurface 300 can be simulated. Reference is made to FIG. 10 below for further details.

In another embodiment, in the supercell 320" shown in FIG. 9, g>0, corresponding to the unit cell 331 provides a phase compensation value of $\delta_g$ degree>0 degree. In this condition, with reference to the curve CPC1 in FIG. 4, the width W1 of the unit cell 331 is a degree greater than 100 nm, but the width W6 of the unit cell 336 is a degree less than 230 nm. In FIG. 9, for example, with g=59 and $\delta_{59}$ degrees=59 degrees, the unit cell 331 provides a phase compensation value of $\delta_{59}$ degrees=59 degrees. With respect to the unit cell 331, the unit cell 332 has a phase compensation value of 60 degrees+$\delta_{59}$ degrees=119 degrees, the unit cell 333 has a phase compensation value of 120 degrees+$\delta_{59}$ degrees=179 degrees, the unit cell 334 has a phase compensation value of 180 degrees+$\delta_{59}$ degrees=239 degrees, the unit cell 335 has a phase compensation value of 240 degrees+$\delta_{59}$ degrees 299 degrees, and the unit cell 336 has a phase compensation value of 300 degrees+$\delta_{59}$ degrees=359 degrees. After the phase compensation values of the unit cell 331, the unit cell 332, the unit cell 333, the unit cell 334, the unit cell 335, and the unit cell 336 are determined, the width W1 of the meta-atom rod 331A, the width W2 of the meta-atom rod 332A, the width W3 of the meta-atom rod 333A, the width W4 of the meta-atom rod 334A, the width W5 of the meta-atom rod 335A and the width W6 of the meta-atom rod 336A can be obtained from the curve CPC1 in FIG. 4.

In one or more embodiments of the present disclosure, $\delta_g$ degree can be regulated to perform a simulation at one degree intervals. In this embodiment, g=0, 1, 2, . . . , 180 can be set to a total of 181 integers to have phase compensation values $\delta_g$=0, 1, 2, . . . , 180 degrees in unit cell 331 respectively. The maximum phase compensation value of the unit cell 331 depends on the maximum width W6 of the meta-atom rod 336A of the unit cell 336 that can provide the maximum phase compensation value in the supercell 320.

Therefore, a variety of patterns of different metasurfaces 300 can be generated quickly and efficiently. These metasurfaces 300 have the same morphology and are all capable of deflecting the light L by an angle θ.

In addition, as shown in FIG. 4, the transmittance is not necessarily positively proportional to the width w of the meta-atom rod 330A. After generating multiple equivalent samples of the metasurfaces 300, the transmittances of each of these samples can be simulated with respect to the light L, and the one with the greatest transmittances can be selected to form the metasurface 300 to systematically maximize the light output efficiency of the integrated light-emitting device 100.

Reference is made to FIG. 10. FIG. 10 is a diagram illustrating the relationship of the transmittance with respect to the adjusted first phase compensation values $\delta_g$ of the first unit cell 331 in the supercell 320 according to one embodiment of the present disclosure. In the example embodiment shown in FIG. 10, the selected light L has a light wavelength of 940 nm.

In FIG. 10, the horizontal axis is the phase compensation value $\delta_g$ of the unit cell 331, and the vertical axis is the transmittance of the formed metasurface 300 relative to the light L, wherein the curve CTM is a curve of transmittance of the light L of the transverse magnetic mode (TM mode), and the curve CTE is a curve of the light L of the transverse electric wave mode (TE mode). The curve CA is the average transmittance of the light L in the TM mode and the light L in the TE mode. According to the curve CA, the transmittance of the metasurface 300 of the light L does not have a peak at the phase compensation value $\delta_g$ degree equal to zero for the unit cell 331, wherein the phase compensation value $\delta_g$ degree equal to zero corresponds to the meta-atom rod 331A with a width W1 of 100 nm. The average transmittance of the light relative to the metasurface 300 has a peak at the first phase compensation value $\delta_g$ degree being in a range between 20 and 40 degrees or between 100 and 120 degrees for the unit cell 331. As shown in FIG. 4, the width W1 of the meta-atom rod 331A is greater than 100 nm when a peak of the transmittance of the light L appears.

In one or more embodiments of the present disclosure, a metasurface 300 with a peak of the transmittance relative of the light L may be selected to be integrated on top of the light-emitting element 200 to form an integrated light-emitting device.

Figure 11B:
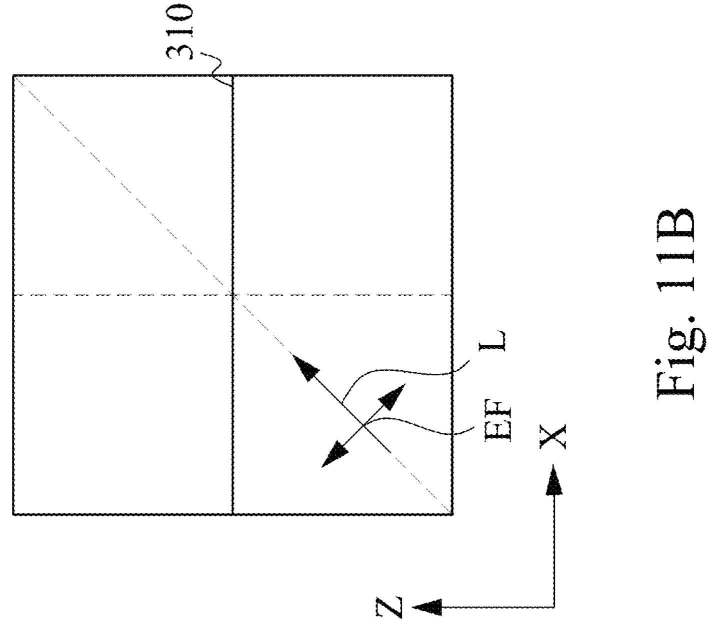
FIG. 11B is a schematic diagram of the light and electric field of the TM mode on the X-Z plane.
Figure 11A:
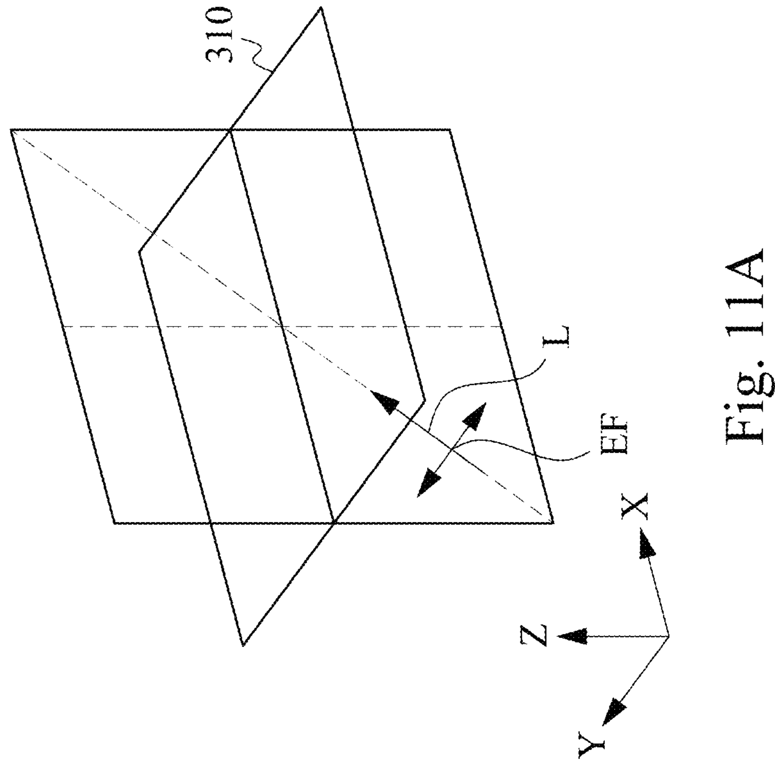
FIG. 11A is a schematic diagram of the light and electric field traveling in a TM mode.

Reference is made to FIG. 11A and FIG. 11B. FIG. 11A is a schematic diagram of the light L and its electric field EF traveling in a TM mode. FIG. 11B is a schematic diagram of the light and its electric field of the TM mode on the X-Z plane. According to FIG. 11A and FIG. 11B, the transmittance of light L at different incidence angles of the metasurface 300 can be simulated with respect to the light L of the TM mode.

Referring to FIGS. 11A and 11B, the light L is incident at an angle of incidence from the substrate 310 of the metasurface 300 in the direction Z to the metasurface 300. The electric field EF of the TM mode light L oscillates in the X-Z plane.

Figure 12B:
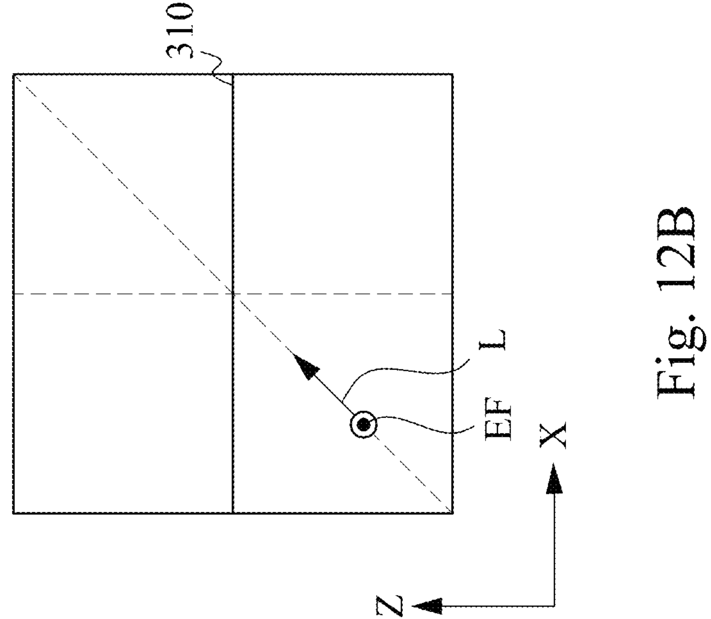
FIG. 12B is a schematic diagram of the light and electric field of the TE mode on the X-Z plane.
Figure 12A:
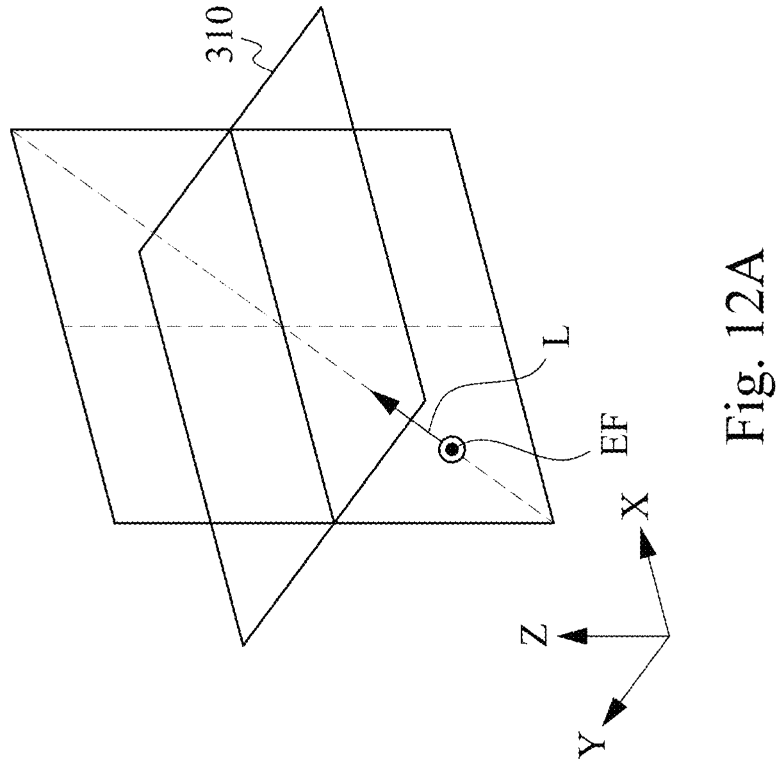
FIG. 12A is a schematic diagram of the light and electric field traveling in a TE mode.

Reference is made to FIG. 12A and FIG. 12B. FIG. 12A is a schematic diagram of the light L and its electric field EF traveling in a TE mode. FIG. 12B is a schematic diagram of the light L and its electric field EF of the TE mode on the X-Z plane. According to FIG. 12A and FIG. 12B, the transmittance of light L at different incidence angles of the metasurface 300 can be simulated with respect to the light L of the TE mode.

Referring to FIGS. 12A and 12B, the light L is incident at an angle of incidence from the substrate 310 of the metasurface 300 in the direction Z to the metasurface 300. The electric field EF of the light L in the TM mode oscillates vertically through the X-Z plane.

Figure 13:
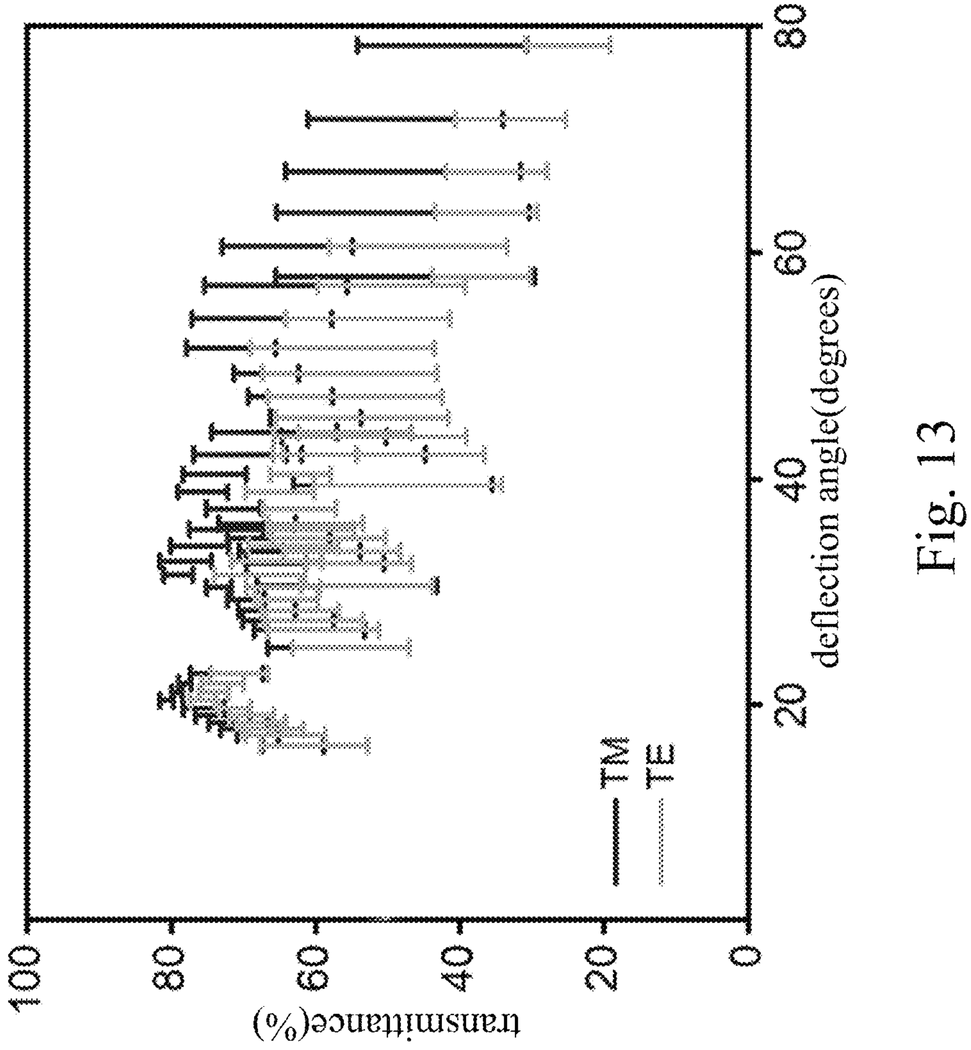
FIG. 13 is a diagram illustrating a relationship of transmittance of light with TM mode or TE mode with respect to the different deflection angles according to one embodiment of the present disclosure.

FIG. 13 is a diagram illustrating a relationship of transmittance of light L with TM mode or TE mode with respect to the different deflection angles θ according to one embodiment of the present disclosure. In this embodiment, the light L has a light wavelength of 940 nm, for example.

In FIG. 13, the horizontal axis is the deflection angle θ, and the vertical axis is the transmittance of the relative light L. In FIG. 13, for a specific deflection angle θ, the metasurfaces 300 with different phase compensation values can be set. In FIG. 13, for a particular deflection angle θ, multiple equivalent states of the metasurface 300 with different phase compensation values can be set up for simulation, so that for each deflection angle θ, the metasurface 300 can simulate multiple different transmittances with respect to the light L. Obviously, if the phase compensation value of the unit cell 330 in the supercell 320 of the metasurface 300 can be adjusted, the metasurface 300 samples with different phase retardation values have different transmittances with respect to the light L. According to FIG. 13, it is possible to select a metasurface 300 with a suitable phase compensation value according to the polarization distribution properties of the light L.

Figure 14:
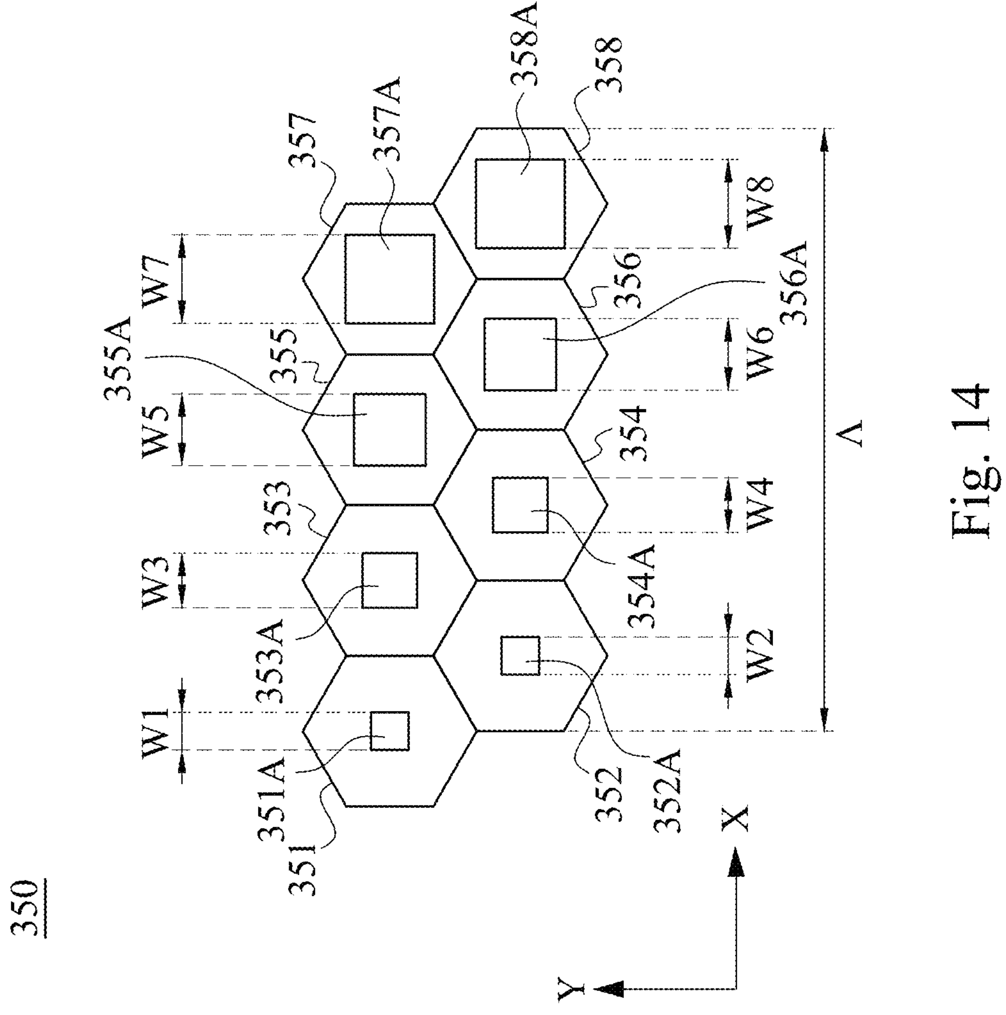
FIG. 14 illustrates a schematic top view of a supercell of a metasurface according to one embodiment of the present disclosure.

FIG. 14 illustrates a schematic top view of a supercell 350 of a metasurface according to one embodiment of the present disclosure.

In another embodiment of the present disclosure, a metasurface can be formed by rearranging supercells 350 in the direction X. To simplify the description, the same labeling is used for similar components.

In FIG. 14, the supercell 350 has a supercell period length Λ in the direction X. In this condition, according to the equal of the aforementioned relation (2), the supercell 350 forms a metasurface similar to the metasurface 300 formed by the supercell 320' in FIG. 8 or the supercell 320" in FIG. 9, which is capable of deflecting the light L by a deflection angle θ along the direction X.

In this embodiment, the supercell 350 includes a unit cell 351, a unit cell 352, a unit cell 353, a unit cell 354, a unit cell 355, a unit cell 356, a unit cell 357 and a unit cell 358, wherein the unit cell 351 has a meta-atom rod 351A with a width W1, the unit cell 352 has a meta-atom rod 352A with a width W2, the unit cell 353 has a meta-atom rod 353A with a width W3, the unit cell 354 has a meta-atom rod 354A with a width W4, the unit cell 355 has the meta-atom rod 355A with a width W5, the unit cell 356 has the meta-atom rod 356A with a width W6, the unit cell 357 has the meta-atom rod 357A with a width W7, and the unit cell 358 has a meta-atom rod 358A with a width W8. The meta-atom rod 351A, the meta-atom rod 352A, the meta-atom rod 353A, the meta-atom rod 354A, the meta-atom rod 355A, the meta-atom rod 356A, the meta-atom rod 357A, and the meta-atom rod 358A have the same heights.

In this case, once the center of the meta-atom rod 351A is defined as the position x is 0, then the phase compensation values generated by the unit cell 351, the unit cell 352, the unit cell 353, the unit cell 354, the unit cell 355, the unit cell 356, the unit cell 357 and the unit cell 358 must satisfy the previous relation (3). Further, according to the curve CPC1 in FIG. 4, the widths of meta-atom rods in the supercell 350 are determined based on the phase compensation value.

In some embodiments of the present disclosure, the unit cell 351, the unit cell 352, the unit cell 353, the unit cell 354, the unit cell 355, the unit cell 356, the unit cell 357 and the unit cell 358 can have phase compensation values of 0 degrees, 45 degrees, 90 degrees, 135 degrees, 180 degrees, 225 degrees, 270 degrees, 315 degrees, respectively. In some embodiments, the unit cell 351, the unit cell 352, the unit cell 353, the unit cell 354, the unit cell 355, the unit cell 356, the unit cell 357, and the unit cell 358 may respectively have 0 degrees+$\delta_g$ degree, 45 degree+$\delta_g$ degree, 90 degree+$\delta_g$ degree, 135 degree+$\delta_g$ degree, 180 degree+$\delta_g$ degree, 225 degree+$\delta_g$ degree, 270 degree+$\delta_g$ degree, 315 degree+$\delta_g$ degree phase compensation value. However, the phase compensation value of the unit cell 358 of 315 degrees+$\delta_g$ degrees is less than the upper limit of 481.5 degrees. By adjusting the $\delta_g$ degree, the metasurface formed by the supercell 350 can have a peak of transmittance relative to the light of the specific light wavelength.

Figure 15:
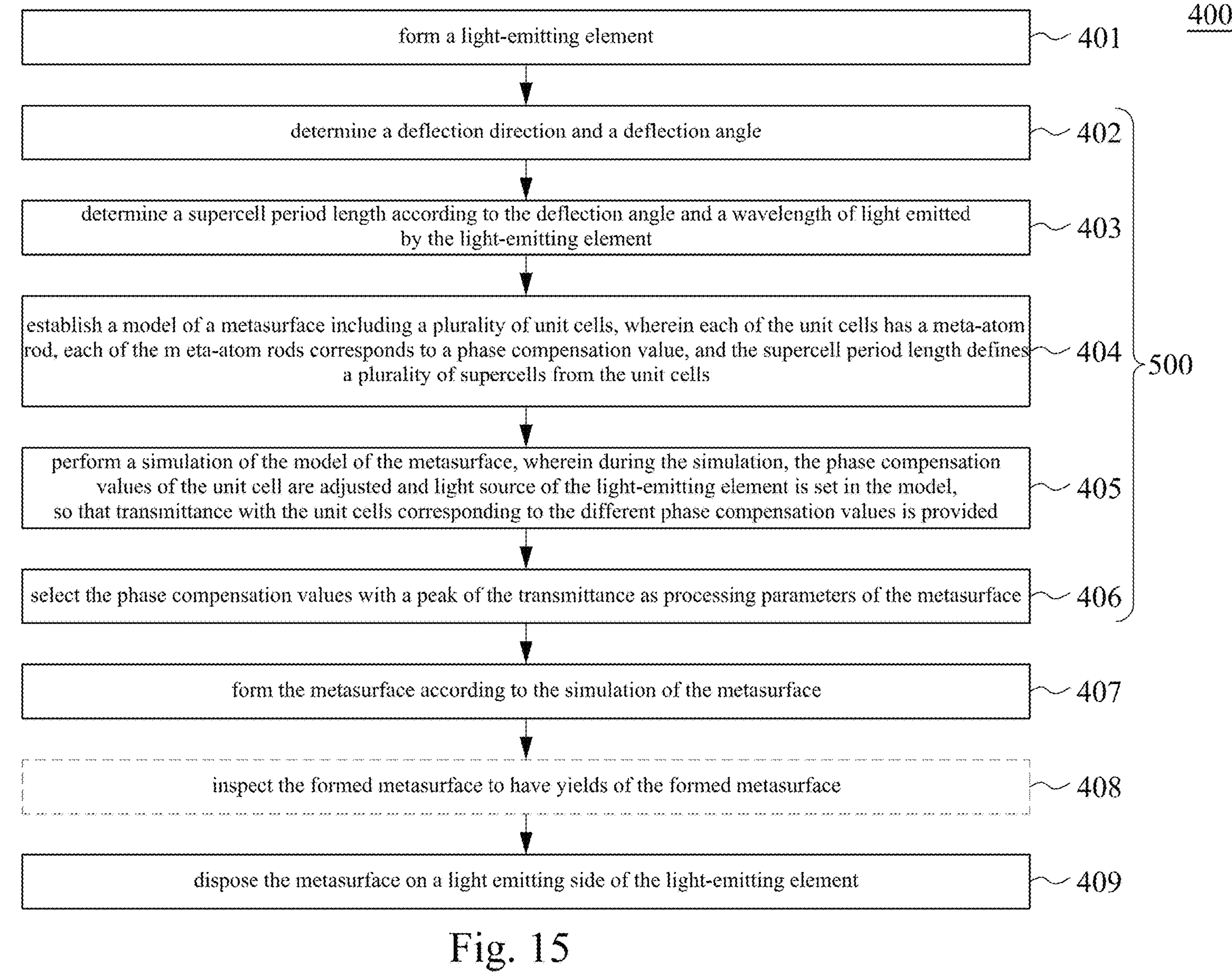
FIG. 15 illustrates a flowchart of a method of forming a light-emitting device according to one embodiment of the present disclosure.

Reference is made to FIG. 15 to further illustrate specific operations of forming a light-emitting device 100 of the present disclosure. FIG. 15 illustrates a flowchart of a method 400 of forming a light-emitting device 100 according to one embodiment of the present disclosure, wherein the method 400 includes a simulation method 500 for simulating the metasurface 300 of the light-emitting device 100.

With additional reference to FIGS. 1A and 1B, in operation 401, a light-emitting element 200 is formed. The light-emitting element 200 has a light source, and the light source can emit light L toward the direction Z at the light-emitting side 210 of the light-emitting element 200.

After operation 401, in operation 402, a deflection direction (e.g., direction X) and a deflection angle θ are determined.

With additional reference is to FIGS. 2A and 2B, in operation 403, a supercell period length Λ in a direction (e.g., direction X) of the metasurface 300 is determined according to the deflection angle θ and a light wavelength of light emitted by the light-emitting element 200.

Subsequently, in operation 404, a model of the metasurface 300 is established, wherein the model of the metasurface 300 includes a plurality of unit cells 330, wherein each of the unit cells 330 has a meta-atom rod 330A, each of the meta-atom rods 330A corresponds to a phase compensation value, and the supercell period length Λ defines a plurality of supercells from the unit cells, as shown in FIGS. 2A and 2B.

In operation 405, a simulation of the model of the metasurface 300 is performed. During the simulation, the phase compensation values of the unit cells 330 are adjusted and light source of the light-emitting element 200 is set in the model, so that transmittance with the unit cells 330 corresponding to the different phase compensation values is provided.

For example, a plurality of the supercells 320 in FIG. 2A can be replaced by creating the supercell 320' in FIG. 8 or the supercell 320" in FIG. 9. As such, the unit cell 331, the unit cell 332, the unit cell 333, the unit cell 334, the unit cell 335 and the unit cell 336 in the supercell 320 are changed. The width W1 of the meta-atom rod 331A, the width W2 of the meta-atom rod 332A, the width W3 of the meta-atom rod 333A, the width W4 of the meta-atom rod 334A, the width W5 of the meta-atom rod 335A and the width W6 of the meta-atom rod 336A can be adjusted, so as to realize the control of the phase compensation values of the unit cell 331, the unit cell 332, the unit cell 333, the unit cell 334, the unit cell 335 and the unit cell 336. For the specific arrangement, reference is made to FIG. 8 and FIG. 9 and the related description.

In one or more embodiments of the present disclosure, the simulations in operation 405 are performed by a computer.

With additional reference to FIG. 10, in operation 406, the phase compensation values with a peak of the transmittance is selected as processing parameters of the metasurface 300.

It should be noted that operations 402 to 406 can be considered as exemplary operations for simulating one of the simulation methods 500 of the metasurface 300 of the present disclosure.

Following operation 406, in operation 407, the metasurface 300 is formed according to the simulation of the metasurface 300. As shown in FIGS. 1A and 1B, the metasurface 300 and the light-emitting element 200 can be formed separately.

In some embodiments of the present disclosure, before the substrate 310 of the metasurface 300 is heterogeneously bonded to the light-emitting side 210 of the light-emitting element 200, the manufacturing method 400 further includes a selective operation 408 (shown as a dashed line) that can test the yields of the metasurface 300 and the light-emitting element 200, respectively. For example, the intensity of the light L emitted by the light-emitting element 200 can be inspected to confirm whether the formed light-emitting element 200 conforms to the design or whether the light with the light wavelength and emitted by light-emitting element 200 has a simulated transmittance with respect to the formed metasurface 300.

With additional reference to FIG. 1C, in operation 409, a metasurface 300 is disposed on the light-emitting side 210 of the light-emitting element 200. In one or more embodiments of the present disclosure, the substrate 310 of the metasurface 300 can be heterogeneously bonded to the light-emitting side 210 of the light-emitting element 200.

In some example implementations, the disclosed metasurface can be used as a meta-lens. In this case, the phase compensation $\phi_c$ of the designed metasurface can be expressed as the following relation (4):

$$\Phi_c(r) = \frac{2\pi n}{\lambda}\left(f - \sqrt{r^2 + f^2}\right) + \delta_c$$

where λ is the wavelength of the optical element, r is the radius r-axis position of the polar coordinate system on the surface of the element, $\delta_c$ is the phase reference value, and n is an integer. It can be noted that the phase compensation $\phi_c$ can also have the freedom of phase regulation (phase reference value $\delta_c$), so the overall light output efficiency can be maximized by adjusting the phase compensation value of the unit cell 330 in the supercell 320 in the metasurface 300 in a similar way as described above.

In summary, according to one or more embodiments of the present disclosure, the phase compensation value of each unit cell in the metasurface can be adjusted to effectively improve the transmittance of the light emitted from the light-emitting element of the integrated light-emitting device relative to the metasurface, and the material of the integrated surface of the light-emitting element can be adjusted and designed accordingly for different light-emitting elements. The present disclosure can efficiently provide the corresponding adjustment and design for different wavelengths of emitted light. In addition, the heterogeneous bonding of the light-emitting element and the metasurface, by selecting the appropriate material to design the corresponding metasurface, will reduce the strong reflection phenomenon occurring in the heterogeneous integrated interface, reduce the emitting energy loss of the emitting element, and further improve the performance of the formed integrated device.

Although the embodiments of the present disclosure have been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the embodiments of the present disclosure without departing from the scope or spirit of the present disclosure. In view of the foregoing, it is intended that the present disclosure cover modifications and variations of this disclosure provided they fall within the scope of the following claims.

What is claimed is:

1. A method of manufacturing a light-emitting device, comprising:
  forming a light-emitting element;
  performing a simulation of a metasurface by a computer, comprising:
    determining a deflection direction and a deflection angle;
    determining a supercell period length based on the deflection angle and a light wavelength of the light-emitting element;
    establishing a metasurface model of the metasurface, wherein the metasurface model comprises a substrate and a plurality of unit cells defined over the substrate, each of the unit cells comprises a meta-atom rod disposed on the substrate, the unit cells each are associated with a plurality of phase compensation values, and the phase compensation values of the unit cells are spatially arranged along the deflection direction, wherein each phase compensation value represents a phase difference, in degrees, between light entering the meta-atom rod and light leaving the meta-atom rod relative to a reference, and corresponds to a width of the meta-atom rod;
    setting a light source of the light wavelength in the metasurface model;
    adjusting the phase compensation values of the unit cells and the metasurface model to simulate a plurality of transmittances with respect to different phase compensation values in the metasurface model; and
    selecting widths of the meta-atom rods corresponding to the phase compensation values at a peak of the transmittances as a plurality of processing parameters of the metasurface;
  forming the metasurface based on the processing parameters; and
  disposing the metasurface on a light-emitting side of the light-emitting element.

2. The method of claim 1, wherein the substrate comprises a transparent substrate, the meta-atoms are formed on the transparent substrate, and disposing the metasurface on the light-emitting side of the light-emitting element comprises:
  heterogeneously bonding the transparent substrate on the light-emitting side of the light-emitting element.

3. The method of claim 1, wherein the unit cells are periodically arranged in a hexagonal lattice.

4. The method of claim 1, wherein the meta-atom rods comprise a plurality of square rods with the same heights, the meta-atom rods of the unit cells respectively correspond to the phase compensation values of the unit cells, and adjusting the phase compensation values comprises:
  adjusting a plurality of widths of the meta-atom rods.

5. The method of claim 1, wherein a plurality of supercells is defined by the supercell period length from the unit cells of the metasurface model, each of the supercells comprises the unit cells comprising:
  a first unit cell having a first phase compensation value; and
  a plurality of subordinate unit cells arranged equidistantly along the deflection direction relative to the first unit cell, wherein the phase compensation values of subordinate unit cells increase equally along the deflection direction with respect to the first unit cell,
  wherein adjusting the phase compensation values of the unit cells comprises:
  for each of the supercells, adjusting the first phase compensation value of the first unit cell and causing the phase compensation values of the subordinate unit cells to be adjusted with respect to the first phase compensation value.

6. The method of claim 1, wherein the light-emitting element comprises a dielectric layer on the light-emitting side of the light-emitting element, and forming the light-emitting element comprises:
  selecting a material of the dielectric layer based on the formed metasurface to reduce a reflectivity at an interface between the metasurface and the dielectric layer.

7. The method of claim 1, wherein the substrate comprises a transparent substrate configured to be bonded on the light-emitting side of the light-emitting element, and forming the metasurface comprises:
  selecting a material of the transparent substrate according to a layer on the light-emitting side of the light-emitting element to reduce a reflectivity at an interface between the metasurface and the light-emitting element.

8. The method of claim 1, wherein the light wavelength is a wavelength of visible light or near infrared light.

9. The method of claim 1, wherein the peak of the transmittances is a peak of average transmittances of TE waves and TM waves of the light wavelength with respect to the phase compensation values.

10. A method of manufacturing a light-emitting device, comprising:
  forming a light-emitting element;
  forming a metasurface, wherein the metasurface comprises a substrate and a plurality of unit cells defined over the substrate, each of the unit cells has a meta-atom rod disposed over the substrate, each of the meta-atom rods corresponds to a phase compensation value, the phase compensation value represents a phase difference, in degrees, between light entering the meta-atom rod and light leaving the meta-atom rod relative to a reference, and the meta-atom rods have the same heights and different widths and the meta-atom rods have a periodicity of a supercell period length of the metasurface along a deflection direction, wherein the supercell period length is determined based on a determined deflection angle with respect to a direction along which light is emitted from a light-emitting side of the light-emitting element before being deflected by the metasurface and a light wavelength of the light-emitting element; and bonding the metasurface on the light-emitting side of the light-emitting element.

11. The method of claim 10, further comprising:

before the metasurface is bonded on the light-emitting side of the light-emitting element, detecting a transmittance of the metasurface.

12. The method of claim 11, wherein the unit cells are periodically arranged in a hexagonal lattice.

13. The method of claim 11, wherein the meta-atom rods comprise a plurality of square rods respectively inducing the phase compensation values of the unit cells, and forming the metasurface comprises:

adjusting a plurality of widths of the meta-atom rods so that the metasurface has a peak of transmittance of light wavelength with respect to the phase compensation values.

14. The method of claim 11, wherein the light-emitting element comprises a dielectric layer on the light-emitting side, the substrate comprises a transparent substrate on which the meta-atom rods are located, wherein bonding the metasurface on the light-emitting side of the light-emitting element comprises heterogeneously bonding a side of the transparent substrate opposite to the meta-atom rods on the dielectric layer of the light-emitting element, and the transparent substrate and the dielectric layer are selected to reduce a reflectivity at an interface between the transparent substrate of the metasurface and the dielectric layer of the light-emitting element.

* * * * *